(12) United States Patent
Qu et al.

(10) Patent No.: US 11,735,941 B2
(45) Date of Patent: Aug. 22, 2023

(54) CHARGING METHOD AND CHARGING DEVICE

(71) Applicant: GUANGDONG OPPO MOBILE TELECOMMUNICATIONS CORP., LTD., Guangdong (CN)

(72) Inventors: Chunying Qu, Guangdong (CN); Jun Zhang, Guangdong (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 0 days.

(21) Appl. No.: 16/759,026

(22) PCT Filed: Apr. 18, 2019

(86) PCT No.: PCT/CN2019/083159
§ 371 (c)(1),
(2) Date: Apr. 24, 2020

(87) PCT Pub. No.: WO2020/211026
PCT Pub. Date: Oct. 22, 2020

(65) Prior Publication Data
US 2021/0242706 A1    Aug. 5, 2021

(51) Int. Cl.
H02J 7/00        (2006.01)
G01R 31/3842     (2019.01)
H01M 10/44       (2006.01)

(52) U.S. Cl.
CPC .... *H02J 7/007182* (2020.01); *G01R 31/3842* (2019.01); *H01M 10/44* (2013.01); *H02J 7/00302* (2020.01); *H02J 7/00714* (2020.01)

(58) Field of Classification Search
CPC ................................. H02J 7/007182
(Continued)

(56) References Cited

U.S. PATENT DOCUMENTS 6,043,631 A    3/2000  Tsenter
6,218,812 B1   4/2001  Hanson
(Continued)

FOREIGN PATENT DOCUMENTS

CN    101232110 A    7/2008
CN    103560282 A    2/2014
(Continued)

OTHER PUBLICATIONS

English translation of ISR for PCT application PCTCN 2019083159.
(Continued)

*Primary Examiner* — Jerry D Robbins
(74) *Attorney, Agent, or Firm* — Young Basile Hanlon & MacFarlane, P.C.

(57) ABSTRACT

A charging method and a charging device are provided. The charging method is configured to charge a battery. A charging process of the battery includes at least one constant current stage, and the at least one constant current stage includes a first constant current stage. The method includes: determining an open circuit voltage of the battery; and in the first constant current stage, charging the battery with a first current until the open circuit voltage of the battery reaches a first cut-off voltage, the first cut-off voltage being less than or equal to a standard limited charging voltage of the battery.

20 Claims, 6 Drawing Sheets

(58) Field of Classification Search
USPC ................................................ 320/137, 132
See application file for complete search history.

(56) References Cited

U.S. PATENT DOCUMENTS

| | | | |
|---|---|---|---|
| 6,249,107 B1* | 6/2001 | Wolfe | H01M 10/44 |
| | | | 320/150 |
| 9,178,380 B2* | 11/2015 | Kawai | H02J 7/045 |
| 9,287,727 B1 | 3/2016 | Egan et al. | |
| 2004/0090209 A1* | 5/2004 | Nishida | H02J 7/007182 |
| | | | 320/149 |
| 2011/0156660 A1 | 6/2011 | Cheng et al. | |
| 2012/0206111 A1 | 8/2012 | Park | |
| 2013/0063079 A1 | 3/2013 | Kawai et al. | |
| 2013/0187608 A1 | 7/2013 | Yen | |

FOREIGN PATENT DOCUMENTS

| | | |
|---|---|---|
| CN | 105634073 A | 6/2016 |
| CN | 106655396 A | 5/2017 |
| CN | 106786877 A | 5/2017 |
| CN | 107768757 A | 3/2018 |
| CN | 107808987 A | 3/2018 |
| CN | 108023130 A | 5/2018 |
| DE | 102015206871 A1 | 10/2016 |
| EP | 0311460 A2 | 4/1989 |
| EP | 1254499 B1 | 5/2007 |
| WO | 9407292 A1 | 3/1994 |
| WO | 2016164110 A1 | 10/2016 |

OTHER PUBLICATIONS

Extended European Search Report for EP Application 19924642.2 dated Jun. 16, 2021. (11 pages).
Indian Examination Report for IN Application 202017034855 dated Nov. 25, 2021. (6 pages).
Communication pursuant to Article 94(3) EPC for EP Application 19924642.2 dated Mar. 3, 2022. (8 pages).
Chinese First Office Action with English Translation for CN Application 201980003776.X, dated Sep. 15, 2022. (16 pages).
Communication pursuant to Article 94(3) EPC for EP Application 19924642.2 dated Jul. 11, 2022. (6 pages).
Chinese Office Action with English Translation for CN Application 20198003776.X dated Dec. 12, 2022. (12 pages).
European Telecommunication notice for EP application 19924642.2 dated Feb. 24, 2023. (3 pages).

* cited by examiner determining an open circuit voltage of the battery — S201 in the first constant current stage, applying a first current to the battery until the open circuit voltage of the battery reaches a first cut-off voltage, the first cut-off voltage being less than or equal to a standard limited charging voltage of the battery — S202

CHARGING METHOD AND CHARGING DEVICE

CROSS-REFERENCE TO RELATED APPLICATION(S)

This application is a 371 application of International Application No. PCT/CN2019/083159, filed on Apr. 18, 2019, the entire disclosure of which is hereby incorporated by reference.

TECHNICAL FIELD

The present disclosure relates to the field of charging, and more particularly, to a charging method and a charging device.

BACKGROUND

With the continuous development of electronic devices (such as smart phones), electronic devices are more and more popular with consumers. However, devices to be charged consume large amounts of power and thus need to be charged frequently. In addition, users have higher and higher requirements for the charging speed of electronic devices, hoping to get faster and faster charging speed to save the charging time of electronic devices. However, some existing fast charging methods will cause overcharging of the battery, thereby affecting the service life of the battery.

Therefore, there is an urgent need for a charging method that can increase the charging speed of the battery while ensuring the service life of the battery.

SUMMARY

In a first aspect, a charging method is provided. The charging method is configured to charge a battery. A charging process of the battery includes at least one constant current stage, and the at least one constant current stage includes a first constant current stage. The method includes: determining an open circuit voltage of the battery; and in the first constant current stage, applying a first current to the battery until the open circuit voltage of the battery reaches a first cut-off voltage, the first cut-off voltage being less than or equal to a standard limited charging voltage of the battery.

In a second aspect, a charging device is provided. The charging device is configured to charge a battery. A charging process of the battery includes at least one constant current stage, and the at least one constant current stage includes a first constant current stage. The charging device includes: a processing circuit, configured to determine an open circuit voltage of the battery; and a charging management circuit, configured to, in the first constant current stage, charge the battery with a first current until the open circuit voltage of the battery reaches a first cut-off voltage, the first cut-off voltage being less than or equal to a standard limited charging voltage of the battery.

DETAILED DESCRIPTION

With the continuous development of electronic devices, more and more electronic devices need to be charged. In addition, users have higher and higher requirements for the charging speed of electronic devices, hoping to obtain faster and faster charging speed to save the charging time of electronic devices.

The electronic device mentioned in embodiments of the present disclosure include, but is not limited to: a device configured to receive/transmit a communication signal via a wired line connection (such as a public switched telephone network (PSTN), a digital subscriber line (DSL), a digital cable, a direct cable connection, and/or another data connection/network) and/or via a wireless interface (for example, a cellular network, a wireless local area network (WLAN), a digital TV network such as a digital video broadcasting handheld (DVB-H) network, a satellite network, an amplitude modulation-frequency modulation (AM-FM) broadcast transmitter, and/or a wireless interface of another communication terminal). A terminal configured to communicate via the wireless interface may be referred to as a "wireless communication terminal", a "wireless terminal", and/or a "mobile terminal". Examples of the mobile terminal include, but are not limited to, a satellite phone or a cellular phone, a terminal combining a cell radio phone and a personal communication system (PCS) having capability of data process, fax, and data communication, a personal digital assistant (PDA) including a radio phone, a pager, Internet/Intranet access, a web browser, a note pad & address book, a calendar and/or a global positioning system (GPS) receiver, and a common laptop and/or handheld receiver, or other electronic devices including a radio phone transceiver. In some embodiments, the electronic device may refer to a mobile terminal device or a handheld terminal device, such as a mobile phone, a pad, or the like. In some embodiments, the electronic device mentioned in the embodiments of the present disclosure may be a chip system, and in these embodiments, the battery of the electronic device may or may not belong to the chip system.

In addition, the electronic device may also include other electronic device that needs to power a system, such as a mobile phone, a mobile power source (e.g., a power bank and a travel charger), an electric car, a notebook computer, a drone, a tablet computer, an e-book, an electronic cigarette, a smart electronic device and a small-scale electronic product. The smart electronic device may include, for example, a watch, a bracelet, a pair of smart glasses, a cleaning robot, and the like. The small-scale electronic product may include, for example, a pair of wireless headphones, a Bluetooth speaker, an electric toothbrush, and a rechargeable wireless mouse.

Figures 1, 2:
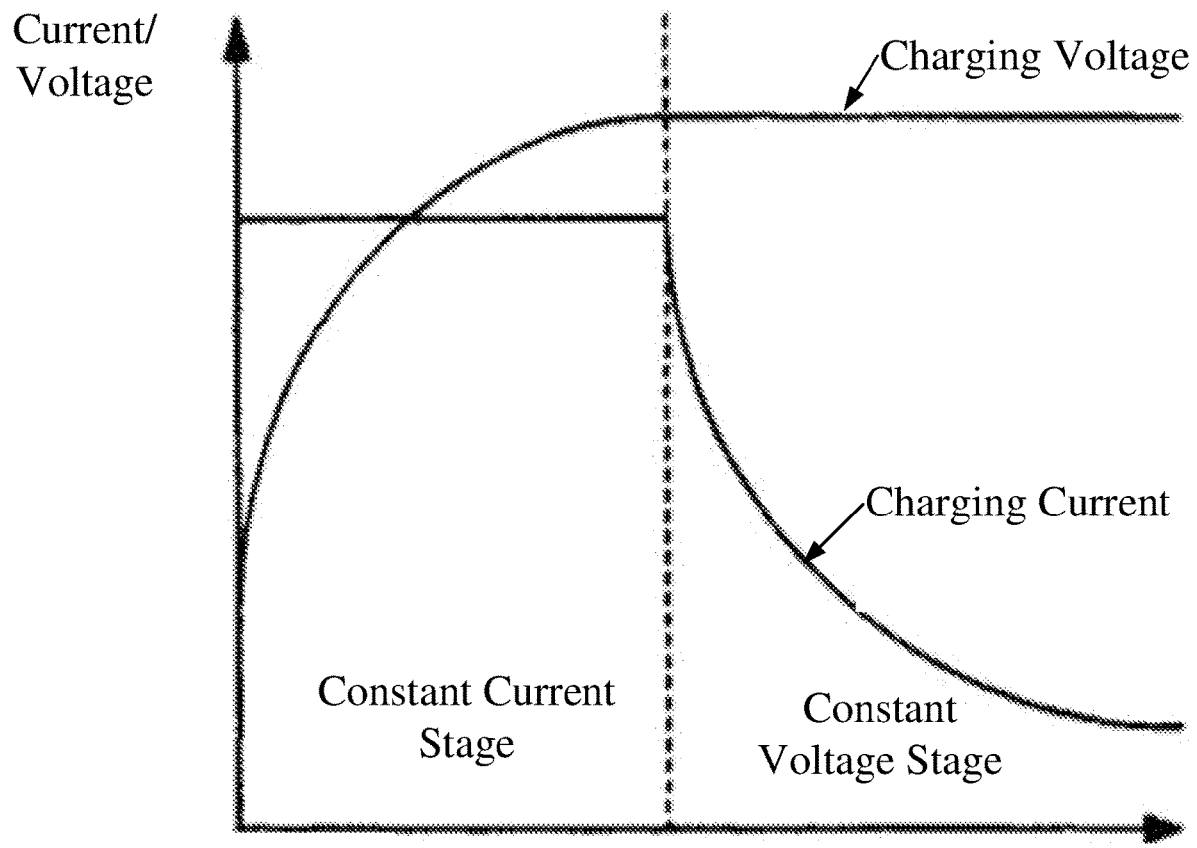
FIG. 1 is a schematic diagram of a constant current and constant voltage charging mode.
FIG. 2 is a schematic flowchart of a charging method according to an embodiment of the present disclosure.

At present, a common fast charging mode is a constant current and constant voltage charging mode. As illustrated in FIG. 1, the constant current and constant voltage charging mode includes one constant current stage and one constant voltage stage. In the constant current stage, a constant current is applied to a battery, and the voltage of the battery gradually increases. When the voltage of the battery reaches a predetermined value, the battery enters the constant voltage stage, and a constant voltage is applied to the battery. In this process, the charging current of the battery will gradually decrease. When the charging current of the battery is decreased to a certain value, it means that the battery is fully charged and the charging may be ended.

In existing charging methods, the charging voltage of the battery is detected. For example, a predetermined value is set for the charging voltage of the battery in the constant current stage. When it is detected that the charging voltage of the battery reaches the predetermined value, the battery enters the constant voltage stage. In the constant voltage stage, the battery is charged with the predetermined value until the charging current of the battery decreases to a certain value. When setting the predetermined value, it is generally guaranteed that the predetermined value is less than or equal to the standard limited charging voltage of the battery, for ensuring the safety of battery charging. However, due to the internal resistance of the battery, when the charging voltage of the battery reaches the predetermined value, the open circuit voltage of the battery, which may also be understood as the actual voltage of the battery, is still less than the predetermined value. Therefore, if the charging voltage of the battery is used as a reference, charging is terminated when the charging voltage of the battery reaches the predetermined value, which may lead to a situation in which the battery cannot be fully charged.

The predetermined value described above may be understood as a charge cut-off voltage of the battery.

For a certain battery system, the standard limited charging voltage of the battery is certain. The standard limited charging voltage may also be referred to as a recommended limited charging voltage. The standard limited charging voltage may be set on the battery before the battery leaves the factory. For example, for a 4.4V battery system, the standard limited charging voltage may be 4.4V.

The charging voltage of the battery in an embodiment of the present disclosure may be understood as a voltage across both ends of the battery during the charging process, or may also be referred to as an output voltage of the battery; and the open circuit voltage of the battery may be understood as a terminal voltage of the battery in an open circuit state, or as a stable voltage between positive and negative electrodes of the battery.

The relationship between the output voltage of the battery and the open circuit voltage of the battery may be expressed by the following equation:

$$V_{cell} = V_{int} + V_{ocv} \qquad \text{(Equation 1)}$$

$V_{cell}$ represents the output voltage of the battery, $V_{ocv}$ represents the open circuit voltage of the battery, $V_{int}$ represents a voltage drop generated by the internal resistance of the battery, and $V_{int} = I*R_b$, where I represents a current flowing through the battery, and $R_b$ represents the internal resistance of the battery.

It may be known from Equation 1 that due to the internal resistance of the battery, the output voltage $V_{cell}$ of the battery is usually less than the open circuit voltage $V_{ocv}$ of the battery during the charging process. If the charge cut-off voltage of the battery is less than or equal to the standard limited charging voltage, the open circuit voltage of the battery must be less than the standard limited charging voltage, resulting in the battery not being fully charged.

There are also some other technologies to increase the charge cut-off voltage of the battery for charging the battery as full as possible, that is, the charge cut-off voltage of the battery is greater than the standard limited charging voltage. However, in this manner, it is difficult to guarantee that the charge cut-off voltage of the battery is consistent with a rated voltage of the battery, which easily leads to the problem of overcharging, which further affects the service life of the battery.

Embodiments of the present disclosure provide a charging method, which may increase the charging speed of the battery while ensuring the service life of the battery.

The charging method according to embodiments of the present disclosure may be configured to charge the battery. The charging process of the battery includes at least one constant current stage, the at least one constant current stage includes a first constant current stage, and the charging method includes blocks S201 to S202.

At block S201, the open circuit voltage of the battery is determined.

At block S202, in the first constant current stage, a first current is applied to the battery until the open circuit voltage of the battery reaches a first cut-off voltage, the first cut-off voltage being less than or equal to the standard limited charging voltage of the battery.

During the charging process of the battery, the open circuit voltage of the battery may be detected in real time to ensure that the open circuit voltage of the battery is less than or equal to the charge cut-off voltage corresponding to a present charging stage. For example, in the constant current stage, the charging current corresponding to the constant current stage is applied to the battery until the open circuit voltage of the battery reaches the charge cut-off voltage corresponding to the constant current stage. After the open circuit voltage of the battery reaches the charge cut-off voltage, the charging may be ended or the next charging stage may be entered.

Taking the first constant current stage as an example, the charging current corresponding to the first constant current stage is the first current, and the charge cut-off voltage corresponding to the first constant current stage is the first cut-off voltage. During the process of applying the first current to the battery, the open circuit voltage of the battery keeps increasing. When it is detected that the open circuit voltage of the battery reaches the first cut-off voltage, it indicates that the charging in the first constant current stage is completed. If the first constant current stage is the last charging stage, the charging may be ended; and if the first constant current stage is not the last charging stage, the next charging stage may be entered.

The first cut-off voltage is less than or equal to the standard limited charging voltage of the battery. For a certain battery system, the standard limited charging voltage of the battery is certain. Such a standard limited charging voltage may also be referred to as a recommended limited charging voltage, or a well-known limited charging voltage. The standard limited charging voltage may be set on the battery before the battery leaves the factory. For example, for the 4.4V battery system, the standard limited charging voltage may be 4.4V.

It may be known from Equation 1 that when the open circuit voltage of the battery is less than or equal to the standard limited charging voltage, the charging voltage of the battery is greater than the standard limited charging voltage. Since a higher charging voltage may be applied to the battery, the charging method according to embodiments of the present disclosure may extend the charging time in the constant current stage, thereby improving the charging speed of the battery. In addition, since the open circuit voltage of the battery may clearly reflect an actual voltage state of the battery, charging the open circuit voltage of the battery to a state close to the standard limited charging voltage may ensure to a certain extent that, the battery is fully charged without affecting the service life of the battery.

In order to ensure the safety of the battery during the charging process, a preset target value may be set for the charging voltage of the battery in the charging process, to ensure that the charging voltage of the battery does not exceed the preset target value. The preset target value may be an upper limit of the charging voltage of the battery on the premise of ensuring the charging safety of battery. In detail, during the charging process, the charging voltage of the battery may be detected to ensure that the charging voltage of the battery does not exceed the preset target voltage. The preset target voltage may be greater than the standard limited charging voltage of the battery, and may be 100 to 200 mV greater than the standard limited charging voltage. For example, assuming that the standard limited cut-off voltage of the battery is 4.4V, the preset target voltage may be any value between 4.5V and 4.6V.

Taking the first constant current stage as an example, as an implementation, the setting of the first cut-off voltage needs to ensure that the charging voltage of the battery does not exceed the preset target voltage. That is, when the open circuit voltage of the battery is the first cut-off voltage, the charging voltage of the battery is less than the preset target voltage.

As another implementation, in an embodiment of the present disclosure, two conditions may be set for each charging stage, one is to ensure that the open circuit voltage of the battery is less than or equal to the standard limited voltage, and the other is to ensure that the charging voltage of the battery is less than or equal to the preset target voltage. When the battery does not meet any of the above two conditions during the charging process, the next charging stage will be triggered.

In detail, the open circuit voltage and the charging voltage of the battery may be detected at the same time, and the first current may be applied to the battery until the open circuit voltage of the battery reaches the first cut-off voltage and/or the charging voltage of the battery reaches the preset target voltage. For example, when the open circuit voltage of the battery has not reached the first cut-off voltage, but the charging voltage of the battery has reached the preset target voltage, the battery will still enter the next charging stage, to ensure the charging safety of battery, to prolong the service life of the battery, and to slow the decay rate of the battery. For another example, when the charging voltage of the battery has not reached the preset target voltage, but the open circuit voltage of the battery has reached the first cut-off voltage, the battery will also enter the next charging stage.

The charging process of the battery may include one constant current stage, or may include a plurality of constant current stages.

For the case where the charging process of the battery includes one constant current stage, if the charging process of the battery also includes the constant voltage stage, the constant voltage stage may be entered for applying a constant voltage to the battery, after the open circuit voltage of the battery is charged to the first cut-off voltage in the first constant current stage. If the charging process of the battery does not include the constant voltage stage, and only includes the first constant current stage, the charging may be ended after the open circuit voltage of the battery is charged to the first cut-off voltage in the first constant current stage.

For the case where the charging process of the battery includes a plurality of constant current stages, for example, the charging process of the battery includes the first constant current stage and the second constant current stage, the first constant current stage and the second constant current stage may be two adjacent constant current stages in the plurality of constant current stages. When the open circuit voltage of the battery is charged to the first cut-off voltage in the first constant current stage, in response to the open circuit voltage of the battery reaching the first cut-off voltage, the second constant current stage may be entered for applying the second current to the battery. The second current is less than the first current.

The method according to embodiments of the present disclosure may be applied to a step charging mode, which may extend the charging time in the constant current stage and improve the charging speed.

The battery according to embodiments of the present disclosure may include one cell or a plurality of cells. The plurality of cells may be cells connected in series, which are not limited in embodiments of the present disclosure.

For the case where the battery includes one cell, the open circuit voltage of the cell may be detected. Taking the first constant current stage as an example, when the open circuit voltage of the cell reaches the first cut-off voltage, it means that the charging in the first constant current stage is completed, and the charging may be ended or the next charging stage may be entered.

In the case where the battery includes a plurality of cells, due to differences in specifications and parameters of the cells, the open circuit voltages of different cells will be different during the charging process of the battery, and thus the open circuit voltage of each of the plurality of cells may be detected. Taking the first constant current stage as an example, when the open circuit voltage of at least one of the plurality of cells reaches the first cut-off voltage, it indicates that the charging in the first constant current stage is completed, and the charging may be ended or the next charging stage may be entered. For example, when the open circuit voltage of any one of the plurality of cells reaches the first cut-off voltage, it indicates that the charging in the first constant current stage is completed. As another example, when the open circuit voltage of each cell in the plurality of cells reaches the first cut-off voltage, it indicates that the charging in the first constant current stage is completed.

The open circuit voltage of each cell in the plurality of cells reaching the first cut-off voltage may indicate that the open circuit voltage of the cell with the lowest voltage in the plurality of cells reaches the first cut-off voltage.

For the battery including the plurality of cells, the open circuit voltages of the plurality of cells may be balanced by an equalization circuit to ensure that the open circuit voltages of the plurality of cells are the same during charging.

In this case, the open circuit voltage of only one of the plurality of cells may be detected, and the next charging stage may be entered after the open circuit voltage of the cell reaches the first cut-off voltage.

Compared with the solution related to one cell, if the solution related to a plurality of cells is to achieve the same charging speed, the charging current required by the plurality of cells is 1/M of the charging current required by the one cell. Similarly, if the same charging current are applied to both the solution related to one cell and the solution related to the plurality of cells, the charging speed of the plurality of cells is M times that of the one cell. Therefore, in the case of using the same charging current, using the plurality of cells may greatly improve the charging speed of the battery.

The charging process of the battery may include only the constant current stage, but not the constant voltage stage. When the first constant current stage is the last constant current stage of at least one constant current stage of the battery, the charging may be ended in response to the open circuit voltage of the battery being charged to the first cut-off voltage. Using only constant current charging may also ensure that the battery is fully charged.

The charging process of the battery may also include at least one constant voltage stage. After the charging in the constant current stage, a constant voltage may be continuously applied to the battery. During the constant voltage charging process, the charging current of the battery gradually decreases, and the open circuit voltage of the battery gradually rises to a voltage close to the charging voltage of the battery. Therefore, the constant voltage charging may be used to further charge the battery to a value close to the rated electric quantity.

The at least one constant voltage stage may include a first constant voltage stage, and the charging voltage corresponding to the first constant voltage stage is the first voltage. When the first constant current stage is the last constant current stage in at least one constant current stage, the first constant voltage stage is entered in response to the open circuit voltage of the battery reaching the first cut-off voltage, for applying the first voltage to the battery. The first voltage is greater than the first cut-off voltage.

Similar to the constant current stage, it is also possible to ensure that the open circuit voltage of the battery is less than the standard limited charging voltage during the constant voltage charging process. In embodiments of the present disclosure, the charge cut-off voltage corresponding to the open circuit voltage may be set for the constant voltage stage. For example, for the first constant voltage stage, the upper limit of the open circuit voltage of the battery corresponding to the first constant voltage stage may be a second cut-off voltage, and constant voltage charging may be performed on the battery with the first voltage until the open circuit voltage of the battery reaches the second cut-off voltage. The second cut-off voltage is less than or equal to the standard limited charging voltage of the battery.

If the charging process of the battery includes only one constant voltage stage, the charging may be ended in response to the open circuit voltage of the battery reaching the second cut-off voltage.

If the charging process of the battery includes a plurality of constant voltage stages, such as including the first constant voltage stage and the second constant voltage stage, the battery enters the second constant voltage stage in response to the open circuit voltage of the battery reaching the second cut-off voltage. The first constant voltage stage and the second constant voltage stage may be two consecutive constant voltage stages in the plurality of constant voltage stages. In the second constant voltage stage, the second voltage is applied to the battery, and the second voltage may be less than the first voltage and greater than the second cut-off voltage.

Setting the plurality of constant voltage stages for performing constant voltage charging on the battery may not only ensure the charging speed of the battery, but also reduce the high-voltage charging time of the battery. For example, in embodiments of the present disclosure, the battery may be charged at a higher voltage for a period of time to ensure the charging speed, and then charged at a lower voltage, thereby reducing the charging time of the battery at a high voltage.

For example, in embodiments of the present disclosure, the open circuit voltage of the battery may be charged to 4.32V by using a voltage of 4.6V, and then the open circuit voltage of the battery may be charged to 4.34V by using a voltage of 4.55V, and so on, until the open circuit voltage of the battery is charged to 4.4V.

If the charging process of the battery includes the plurality of constant voltage stages, and the first constant voltage stage is the last constant voltage stage of the plurality of constant voltage stages, the charging may be terminated in response to the open circuit voltage of the battery reaching the second cut-off voltage.

During the constant voltage charging process, it is also necessary to ensure that the charging voltage corresponding to each constant voltage stage is less than or equal to the preset target voltage, to ensure the safety of battery charging. For example, for the plurality of constant voltage stages, it is necessary to ensure that the maximum charging voltage in the constant voltage stages is less than or equal to the preset target voltage.

The charging method according to an embodiment of the present disclosure will be described in detail below with reference to FIGS. 3 to 4.

Figure 3:
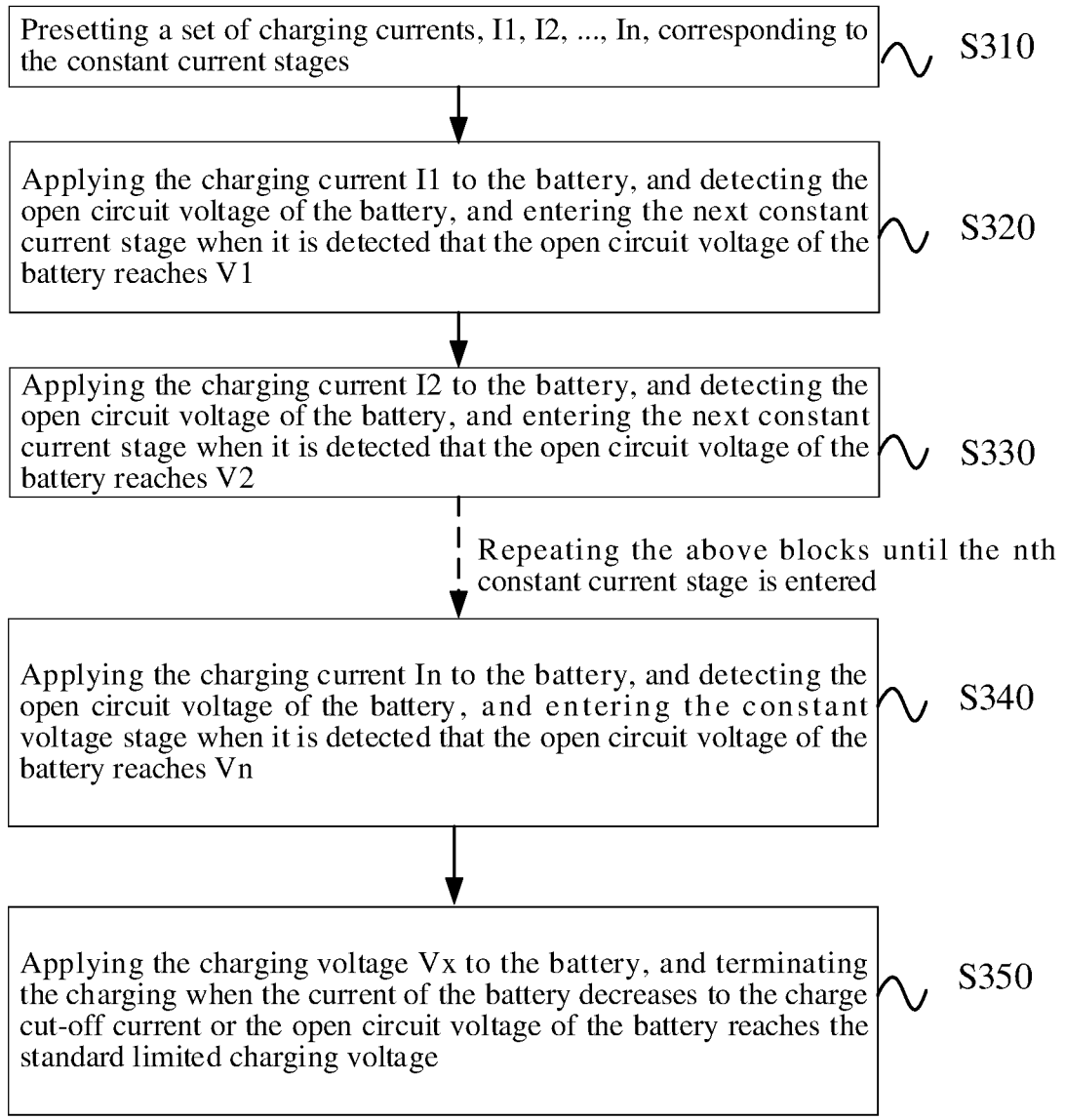
FIG. 3 is a schematic flowchart of a charging method according to another embodiment of the present disclosure.

FIG. 3 is a flowchart of a charging method applicable to a single cell according to an embodiment of the present disclosure. The method in FIG. 3 includes blocks S310 to S350.

At block S310, a set of charging currents, $I_1, I_2, \ldots, I_n$, corresponding to the constant current stages are preset, and cut-off voltages, $V_1, V_2, \ldots, V_n$, are set for respective constant current stages, where n is an integer greater than or equal to 2, $I_1 > I_2 > \ldots > I_n$, and $V_1 < V_2 < \ldots < V_n$. Each charging current corresponds to one constant current stage. The cut-off voltage corresponding to each constant current stage is less than or equal to the standard limited charging voltage, that is, $V_n$ is less than or equal to the standard limited charging voltage.

In addition, the constant voltage stage may be set, and the charging voltage $V_x$, the charge cut-off current, and the charge cut-off voltage corresponding to the constant voltage stage may be set. The charge cut-off voltage may be equal to the standard limited charging voltage.

At block S320, the charging current $I_1$ is applied to the battery, and the open circuit voltage of the battery is detected. When it is detected that the open circuit voltage of the battery reaches $V_1$, the next constant current stage is entered.

At block S330, the charging current $I_2$ is applied to the battery, and the open circuit voltage of the battery is detected. When it is detected that the open circuit voltage of the battery reaches $V_2$, the next constant current stage is entered.

The above blocks are repeated until the nth constant current stage is entered.

At block S340, the charging current In is applied to the battery, and the open circuit voltage of the battery is detected. When it is detected that the open circuit voltage of the battery reaches Vn, the constant voltage stage is entered.

At block S350, the charging voltage Vx is applied to the battery, and when the current of the battery decreases to the charge cut-off current or the open circuit voltage of the battery reaches the standard limited charging voltage, the charging ends. Vx is less than or equal to the preset target voltage, and the preset target voltage may be 100 mA to 200 mA greater than the standard limited charging voltage.

The charge cut-off current may be preset or determined according to the battery system. The charge cut-off current is, for example, the minimum charge cut-off current. For the 4.4V battery system, the minimum charge cut-off current may be 100 mA. For the constant voltage stage, when the charging current of the battery is reduced to 100 mA, it means that the battery is fully charged and the charging may be ended.

For the above charging process, during the constant current charging stage, the charging voltage of the battery may also be detected to ensure that the charging voltage of the battery is less than or equal to the preset target voltage. In any constant current stage, as long as it is detected that the charging voltage of the battery reaches the preset target voltage, the next charging stage may be entered directly, so that the charging safety of the battery may be ensured.

Of course, a plurality of constant voltage stages may also be set, and the charging voltages corresponding to the plurality of constant voltage stages are Vx1, Vx2, ..., Vxn, where Vx1>Vx2> ... >Vxn. The charging voltage corresponding to each constant voltage stage may be less than the preset target voltage of the battery, that is, Vx1 is less than or equal to the preset target voltage. The limited charging currents corresponding to the plurality of constant voltage stages are Ix1, Ix2, ..., Ixn, where Ix1>Ix2> ... >Ixn. The limited charging voltages corresponding to the plurality of constant voltage stages may be Vm1, Vm2, ..., Vmn, where Vm1<Vm2< ... <Vmn. The limited charging voltage corresponding to each constant voltage stage is less than or equal to the standard limited charging voltage, that is, Vmn is less than or equal to the standard limited charging voltage.

After block S340 is ended, the constant voltage stage may be entered. The voltage Vx1 is applied to the battery, and the open circuit voltage and the charging current of the battery are detected. When it is detected that the open circuit voltage of the battery reaches Vm1, or the charging current of the battery reaches Ix1, the next constant voltage stage is entered. The voltage Vx2 is then applied to the battery, and the open circuit voltage of the battery and the charging current of the battery are detected. When it is detected that the open circuit voltage of the battery reaches Vm2, or the charging current of the battery reaches Ix2, the next constant voltage stage is entered. The above steps are repeated until the nth constant voltage stage is entered. In the nth constant voltage stage, the voltage Vxn is applied to the battery, and the open circuit voltage of the battery and the charging current of the battery are detected. When it is detected that the open circuit voltage of the battery reaches Vmn, or the charging current of the battery reaches Ixn, the charging ends.

Figure 4:
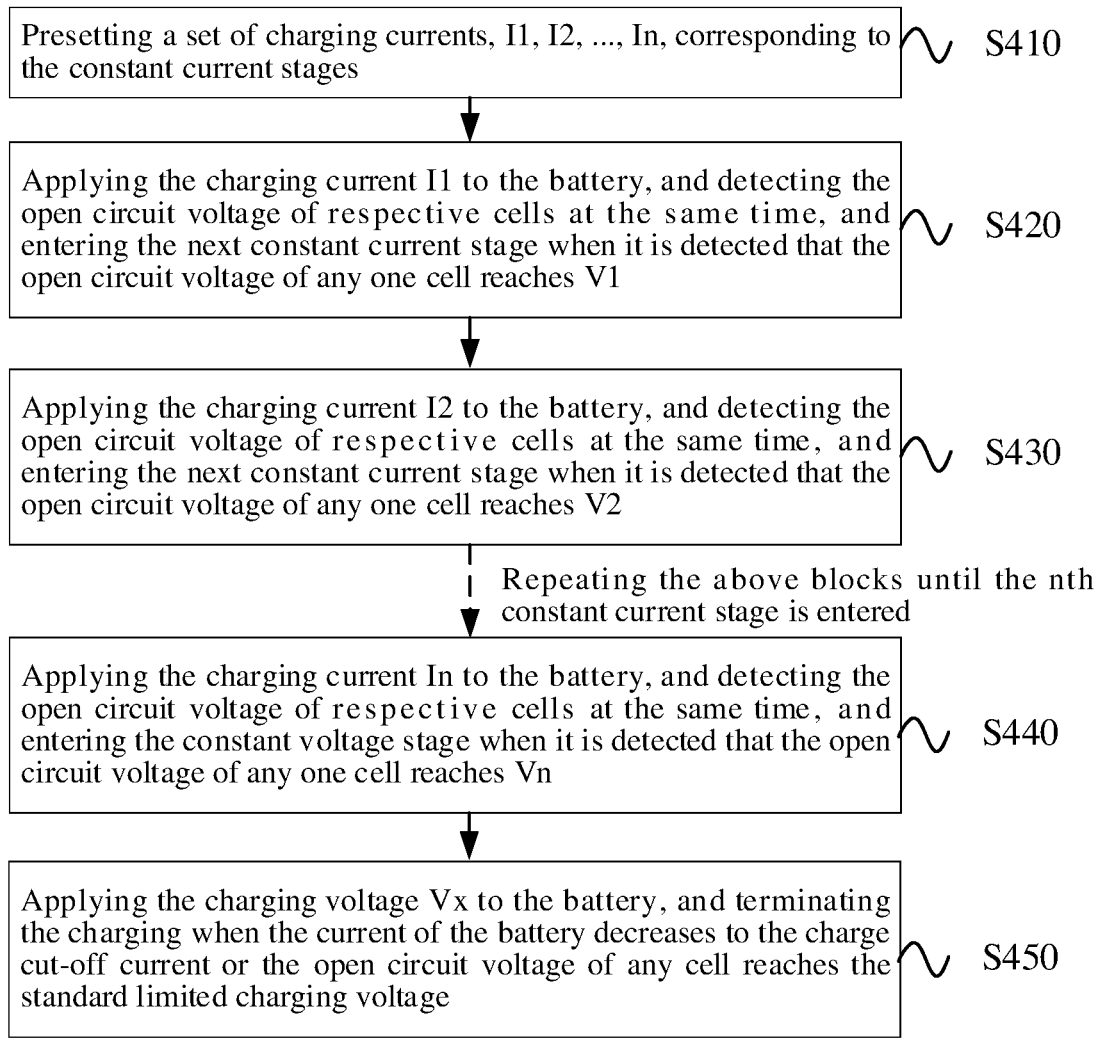
FIG. 4 is a schematic flowchart of a charging method according to yet another embodiment of the present disclosure.

FIG. 4 is a flowchart of a charging method applicable to a plurality of cells according to an embodiment of the present disclosure. The method in FIG. 4 includes blocks S410 to S450.

The method illustrated in FIG. 4 is similar to the method illustrated in FIG. 3. The method illustrated in FIG. 4 detects the open circuit voltage of each of the plurality of cells, while the method illustrated in FIG. 3 only needs to detect the open circuit voltage of only one cell.

At block S410, a set of charging currents, I1, I2, ..., In, corresponding to the constant current stages are preset, and cut-off voltages, V1, V2, ..., Vn, are set for respective constant current stages, where n is an integer greater than or equal to 2, I1>I2> ... >In, and V1<V2< ... <Vn. Each charging current corresponds to one constant current stage. The cut-off voltage corresponding to each constant current stage is less than or equal to the standard limited charging voltage, that is, Vn is less than or equal to the standard limited charging voltage.

In addition, the constant voltage stage may be set, and the charging voltage Vx, the charge cut-off current, and the charge cut-off voltage corresponding to the constant voltage stage may be set. The charge cut-off voltage may be equal to the standard limited charging voltage.

At block S420, the charging current I1 is applied to the battery, and the open circuit voltage of each cell is detected at the same time. When it is detected that the open circuit voltage of any one cell reaches V1, the next charging stage is entered.

At block S430, the battery is charged with the charging current I2, and the open circuit voltage of each cell is detected at the same time. When it is detected that the open circuit voltage of any one cell reaches V2, the next charging stage is entered.

The above blocks are repeated until the nth charging stage is entered.

At block S440, the charging current In is applied to the battery, and the open circuit voltage of each cell is detected at the same time. When it is detected that the open circuit voltage of any one cell reaches Vn, the constant voltage stage is entered.

At block S450, the charging voltage Vx is applied to the battery, and when the current of the battery decreases to the charge cut-off current or the open circuit voltage of any cell reaches the standard limited charging voltage, the charging ends. Vx is less than or equal to the preset target voltage. The preset target voltage may be 100 mA to 200 mA greater than the standard limited charging voltage. For example, assuming that the standard limited charging voltage is 4.4V, the preset target voltage may be any value between 4.5V and 4.6V.

The charge cut-off current may be preset or determined according to the battery system. The charge cut-off current is, for example, the minimum charge cut-off current. For the 4.4V battery system, the minimum charge cut-off current may be 100 mA. For the constant voltage stage, when the charging current of the battery is reduced to 100 mA, it means that the battery is fully charged and the charging may be ended.

For the above charging process, during the constant current charging stage, the charging voltage of the battery may also be detected to ensure that the charging voltage of the battery is less than or equal to the preset target voltage. In any constant current stage, as long as it is detected that the charging voltage of the battery reaches the preset target voltage, the next charging stage may be entered directly, so that the charging safety of the battery may be ensured.

Similar to the method illustrated in FIG. 3, for the plurality of cells, the plurality of constant voltage stages may also be set. For specific setting methods and charging processes, reference may be made to the description above. Different from the method illustrated in FIG. 3, the method illustrated in FIG. 4 needs to detect the voltage of each of the plurality of cells, and the next charging stage is entered or the charging is ended when the voltage of any cell reaches the limited voltage. The specific process will not be repeated.

For the plurality of constant voltage stages described above, it is possible to set only the charge cut-off voltage and not the charge cut-off current. During the charging process, only the open circuit voltage of the battery is detected, and when the open circuit voltage of the battery reaches the cut-off voltage corresponding to the present charging stage, the next charging stage is entered.

Optionally, the charge cut-off voltages corresponding to the plurality of constant voltage stages may be the same, for example, may be the standard limited charging voltage. In any constant voltage stage, as long as it is detected that the open circuit voltage of the battery reaches the standard limited charging voltage, even if the charging current of the battery has not reached the charge cut-off current corresponding to the present charging stage, the charging is terminated, thereby ensuring that the open circuit voltage of the battery does not exceed the standard limited charging voltage, and guaranteeing the charging safety of the battery.

For the plurality of cells, due to the differences in specifications and parameters of the cells, the open circuit voltages of different cells will be different during the charging process of the battery. Therefore, the equalization circuit may be set to equalize the voltages of the plurality of cells. For a charging device provided with the equalization circuit, since the consistency of the open circuit voltages of the plurality of cells may be ensured, it is possible to merely detect the open circuit voltage of only one cell of the plurality of cells during the charging process. After the open circuit voltage of the cell reaches the cut-off voltage corresponding to the present charging stage, the next charging stage is entered.

The implementation of the equalization circuit is not limited in embodiments of the present disclosure. For example, a load may be connected to both ends of a cell to consume the power of the cell, so as to make the power of the cell consistent with the power of other cells, so that the voltages of respective cells are kept consistent. Alternatively, equalization may be performed by using a cell with high power to charge a cell with low power until the voltages of respective cells are consistent. As another example, the equalization circuit may be a Cuk circuit. For example, the equalization circuit may be an equalization circuit based on an RLC series circuit, or an equalization circuit based on Buck-Boost.

For an electronic device including a plurality of cells, during the power supply process, a buck circuit may be used to reduce the voltage of the plurality of cells, for powering the system of the electronic device, or a single cell may be used to power the system. In addition, during the charging process, if the system needs to be powered, a path may be separated to power the system.

Of course, in embodiments of the present disclosure, the voltages of the plurality of cells may be equalized by using the equalization circuit during a discharging process. For the implementation of the equalization circuit, reference may be made to the description above.

It may be understood that, detecting the open circuit voltage of the battery mentioned in embodiments of the present disclosure may refer to directly detecting the open circuit voltage of the battery, or may refer to indirectly detecting the open circuit voltage of the battery. Directly detecting the open circuit voltage of the battery may refer to detecting the open circuit voltage of the battery by a measuring instrument. Indirectly detecting the open circuit voltage of the battery may refer to detecting the charging parameters of the battery, and then calculating the open circuit voltage of the battery indirectly. The method for detecting the open circuit voltage of the battery is described in detail below.

The measurement method of the open circuit voltage of the battery is not limited in embodiments of the present disclosure. For example, a coulometer may be used to measure the open circuit voltage of the battery. The coulometer may directly measure the open circuit voltage of the battery. As another example, a first parameter of the battery may be detected by a detection circuit, and the open circuit voltage of the battery may be determined according to a pre-established model and the first parameter. The first parameter may include at least one of the following parameters: a charging current, a charging voltage, an electric quantity, and a temperature. During the charging process of the battery, the open circuit voltage of the battery may be deduced by measuring the first parameter.

The specific process of establishing the model may be implemented by the following process. Several batteries of the same batch with the same model, performance, parameters and manufacturing process are selected, and charged to different electric quantities at different temperatures and with different charging currents. Voltages of the batteries are measured after standing for a period of time. The voltages across both ends of the battery after standing may be understood as the open circuit voltages of the battery. A model between the open circuit voltages of the batteries and the charging currents of the batteries, the temperatures of the batteries and the electric quantities of the batteries is established. In the actual charging process, the open circuit voltage of the battery may be deduced from the established model.

Embodiments of the present disclosure also provide another method for measuring the open circuit voltage of the battery, and the specific process is as follows. According to actual experience and data fitting, the relationship between the voltage drop $V_{int}$ generated by the internal resistance of the battery and the open circuit voltage $V_{ocv}$ of the battery and the temperature of the battery may be expressed by a first correction coefficient $K_1$ and a second correction coefficient $K_2$, as expressed in Equation 2.

$$V_{int} = K_1 * K_2 * \frac{dV_{ocv}}{dt} \quad \text{(Equation 2)}$$

Equation 3 may be obtained by substituting Equation 2 into Equation 1.

$$V_{ocv} = V_{cell} - K_1 * K_2 * \frac{dV_{ocv}}{dt} \quad \text{(Equation 3)}$$

After discretizing Equation 3, Equation 4 may be obtained.

$$V_{ocv}(k) = V_{cell}(k) - K_1 * K_2 * \frac{V_{ocv}(k) - V_{ocv}(k-1)}{\Delta t} \quad \text{(Equation 4)}$$

$\Delta t$ represents a time interval between a k-th sampling time point and a (k−1)-th sampling time point. Equation 5 may be obtained by rearranging Equation 4.

$$V_{ocv}(k) = \frac{V_{cell}(k)\Delta t + K_1 K_2 V_{ocv}(k-1)}{\Delta t + K_1 K_2} \quad \text{(Equation 5)}$$

From Equation 5, in a case where the output voltage $V_{cell}$ of the battery, the open circuit voltage of the battery at the previous time point, the first correction coefficient $K_1$, and the second correction coefficient $K_2$ corresponding to the temperature of the battery are known, the open circuit voltage of the battery may be calculated in real time.

Therefore, the open circuit voltage of the battery at any time may be calculated from the open circuit voltage at the previous time point. The open circuit voltage of the battery at an initial time point may be equal to the output voltage of the battery at the initial time point. The initial time point may be the time point when the battery is not yet charged. In an uncharged state, it may be assumed that the open circuit voltage of the battery is equal to the output voltage of the battery.

The first correction coefficient $K_1$ is related to the open circuit voltage of the battery, and the second correction coefficient $K_2$ is related to the temperature of the battery. A correspondence relationship (1) between the first correction coefficient $K_1$ and the open circuit voltage of the battery and a correspondence relationship (2) between the second correction coefficient $K_2$ and the temperature of the battery may be obtained through experimental tests.

In this way, during the calculation, the first correction coefficient $K_1$ and the second correction coefficient $K_2$ for real-time calculation may be obtained according to the temperature of the battery and the open circuit voltage of the battery detected at the previous time point, the correspondence relationship (1) and the correspondence relationship (2).

The first correction coefficient $K_1$ and the second correction coefficient $K_2$ may be obtained by the following sampling method. Several batteries of the same batch with the same model, performance, parameters and manufacturing process are selected and placed in a thermotank, charging and discharging voltages and currents of the batteries are detected with a high precision multimeter and recorded, and then a digital statistical analysis is performed on the recorded data to obtain data required.

The charging method according to embodiments of the present disclosure is described in detail above. The charging device according to an embodiment of the present disclosure will be described below with reference to FIGS. 5 to 11. It should be understood that features of the method embodiments are also applicable to the device embodiments. The device embodiments and the method embodiments correspond to each other, so for parts that are not described in detail, reference may be made to the foregoing method embodiments.

Figure 5:
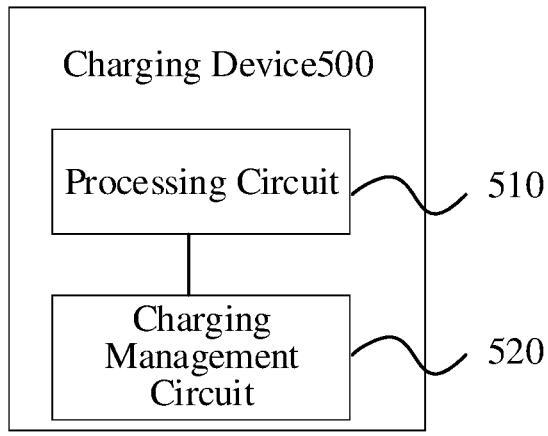
FIG. 5 is a schematic block diagram of a charging device according to an embodiment of the present disclosure.

A charging device 500 as illustrated in FIG. 5 may be configured to charge the battery. The charging process of the battery may include at least one constant current stage, and the at least one constant current stage may include the first constant current stage. The charging device 500 may include a processing circuit 510 and a charging management circuit 520.

The processing circuit 510 is configured to determine the open circuit voltage of the battery.

The charging management circuit 520 is configured to, in the first constant current stage, charge the battery with the first current until the open circuit voltage of the battery reaches the first cut-off voltage, the first cut-off voltage being less than or equal to the standard limited charging voltage of the battery.

Optionally, the battery includes a plurality of cells, and the charging management circuit 520 is configured to charge the battery with the first current until a voltage of at least one of the plurality of cells reaches the first cut-off voltage.

Optionally, when the open circuit voltage of the battery is less than the first cut-off voltage, the charging voltage of the battery is less than the preset target voltage, the preset target voltage being greater than the standard limited charging voltage of the battery.

Optionally, the charging management circuit 520 is further configured to, in response to the open circuit voltage of the battery reaching the first cut-off voltage, enter the second constant current stage for applying the second current to the battery, the second current being less than the first current.

Optionally, the first constant current stage is a last constant current stage of the at least one constant current stage, and the charging management circuit 520 is further configured to, in response to the open circuit voltage of the battery reaching the first cut-off voltage, terminate the charging.

Optionally, the first constant current stage is the last constant current stage of the at least one constant current stage, the charging process of the battery further includes at least one constant voltage stage, and the at least one constant voltage stage includes the first constant voltage stage, and the charging management circuit 520 is further configured to, in response to the open circuit voltage of the battery reaching the first cut-off voltage, enter the first constant voltage stage for applying the first voltage to the battery, the first voltage being greater than the first cut-off voltage.

Optionally, the charging management circuit 520 is configured to charge the battery with the first voltage until the open circuit voltage of the battery reaches the second cut-off voltage, the second cut-off voltage being less than the standard limited charging voltage of the battery and being greater than the first cut-off voltage.

Optionally, the at least one constant voltage stage further includes the second constant voltage stage, and the charging management circuit 520 is further configured to, in response to the open circuit voltage of the battery reaching the second cut-off voltage, enter the second constant voltage stage for applying the second voltage to the battery, the second voltage being greater than the second cut-off voltage and less than the first voltage.

Optionally, the first constant voltage stage is the last constant voltage stage of the at least one constant voltage stage, and the charging management circuit 520 is further configured to, in response to the open circuit voltage of the battery reaching the second cut-off voltage, terminate the charging.

Optionally, the first voltage is less than the preset target voltage, the preset target voltage being greater than the standard limited charging voltage of the battery.

Optionally, the processing circuit 510 is configured to determine the open circuit voltage of the battery according to the pre-established model and the first parameters of the battery in the charging process, the first parameters including at least one of the charging voltage, the charging current, the electric quantity, and the temperature, and the pre-established model including the correspondence relationship between the open circuit voltage of the battery and at least one of the first parameters.

A wired charging process applied to an embodiment of the present disclosure will be described below with reference to FIGS. 6 to 11.

Figure 6:
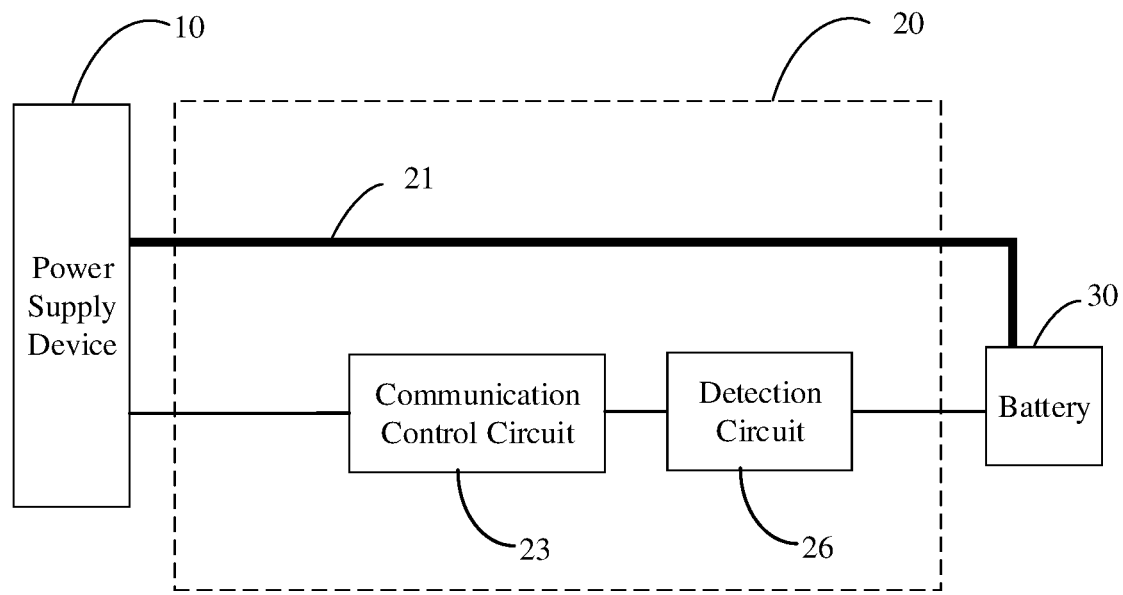
FIG. 6 is a schematic block diagram of a wired charging system according to an embodiment of the present disclosure.

FIG. 6 is a schematic diagram of a charging system according to an embodiment of the present disclosure. The charging system includes a power supply device 10, a battery management circuit 20, and a battery 30. The battery management circuit 20 may be configured to manage the battery 30. The battery management circuit 20 may be understood as the charging management circuit described above, and may be configured to manage the charging process of the battery.

As an example, the battery management circuit 20 may manage the charging process of the battery 30, such as selecting a charging channel, controlling a charging voltage and/or a charging current, and so on. As another example, the battery management circuit 20 may manage cells of the battery 30, such as, equalizing voltages of the cells in the battery 30 and the like.

The battery management circuit 20 may include a first charging channel 21 and a communication control circuit 23.

The first charging channel 21 may be configured to receive a charging voltage and/or a charging current provided by the power supply device 10, and to load the charging voltage and/or the charging current to both ends of the battery 30 for charging the battery 30.

The first charging channel 21 may be, for example, a wire, and other circuit elements that are not related to a conversion of the charging voltage and/or the charging current may also be provided on the first charging channel 21. For example, the battery management circuit 20 includes the first charging channel 21 and a second charging channel. The first charging channel 21 may be provided with a switching element for switching between charging channels (see the description of FIG. 10 for details).

The power supply device 10 may be the power supply device with adjustable output voltage described above, and the type of the power supply device 20 is not specifically limited in embodiments of the present disclosure. For example, the power supply device 20 may be a device dedicated to charging, such as an adapter and a power bank, or may be another device capable of providing power and data services, such as a computer.

The first charging channel 21 may be a direct charging channel that may directly load the charging voltage and/or the charging current provided by the power adapter 10 to both ends of the battery 30. In order to implement the direct charging, a control circuit with a communication function, that is, the communication control circuit 23, is introduced into the battery management circuit 20 in an embodiment of the present disclosure. The communication control circuit 23 may maintain communication with the power supply device 10 during the direct charging process to form a closed-loop feedback mechanism, so that the power supply device 10 may obtain the state of the battery in real time, thereby continuously adjusting the charging voltage and/or the charging current injected into the first charging channel, to ensure that the charging voltage and/or charging current provided by the power supply device 10 match the present charging stage of the battery 30.

For example, the communication control circuit 23 may communicate with the power supply device 10 when the open circuit voltage of the battery 30 reaches the charge cut-off voltage corresponding to the constant current stage, so that the charging process of the battery 30 performed by the power supply device 10 is switched from constant current charging to constant voltage charging. As another example, the communication control circuit 23 may communicate with the power supply device 10 when the charging current of the battery 30 reaches the charge cut-off current corresponding to the constant voltage stage, so that the charging process of the battery 30 performed by the power supply device 10 is switched from the constant voltage charging to the constant current charging. For another example, the communication control circuit 23 may communicate with the power supply device 10 when the open circuit voltage of the battery 30 reaches the charge cut-off voltage corresponding to the constant voltage stage, so that the power supply device 10 stops supplying power to the battery 30.

The battery management circuit 20 provided in embodiments of the present disclosure may further include a detection circuit 26 configured to detect the open circuit voltage of the battery 30, so that the communication control circuit 23 communicates with the power supply device 10 according to the open circuit voltage of the battery 30.

Of course, the detection circuit 26 may also detect the charging voltage and/or charging current of the battery to ensure that the charging voltage of the battery does not exceed the preset target voltage described above, and/or that in the constant voltage stage, the charging current of the battery is not less than the charge cut-off current corresponding to the present constant voltage stage.

Figure 7:
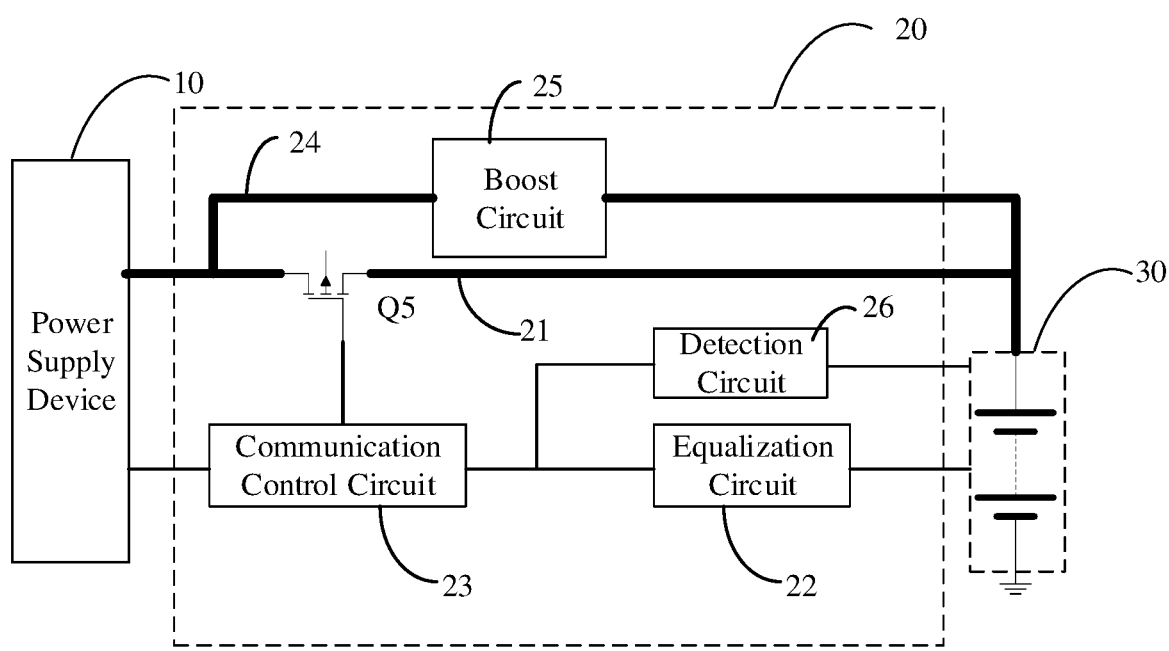
FIG. 7 is a schematic block diagram of a wired charging system according to another embodiment of the present disclosure.

The battery management circuit provided in embodiments of the present disclosure may perform direct charge on the battery. In other words, the battery management circuit provided in embodiments of the present disclosure is a battery management circuit that supports a direct charge architecture. In the direct charge architecture, the direct charge channel does not require a conversion circuit, so that heat generated by a device to be charged during the charging process may be reduced. Optionally, in some embodiments, as illustrated in FIG. 7, the battery management circuit 20 may further include a second charging channel 24. A boost circuit 25 is provided on the second charging channel 24. In the process of charging the battery 30 by the power supply device 10 through the second charging channel 24, the boost circuit 25 may be configured to receive an initial voltage provided by the power supply device 10, to boost the initial voltage to a target voltage, and to charge the battery 30 based on the target voltage, where the initial voltage is less than a total voltage of the battery 30 and the target voltage is greater than the total voltage of the battery 30. The communication control circuit 23 may be further configured to control the switching between the first charging channel 21 and the second charging channel 24.

Assuming that the battery 30 includes a plurality of cells, the second charging channel 24 is compatible with an ordinary power supply device for charging the battery 30, thereby solving a problem that the ordinary power supply device cannot charge a plurality of batteries.

For the battery 30 including a plurality of cells, the battery management circuit 20 may further include an equalization circuit 22. According to the description above, the equalization circuit 22 may be configured to equalize voltages of the plurality of cells during the charging process and/or the discharging process of the battery.

The specific form of the boost circuit 25 is not limited in embodiments of the present disclosure. For example, a Boost circuit may be adopted, and a charge pump may also be adopted for boosting. Optionally, in some embodiments, the second charging channel 24 may be designed in a traditional charging channel manner, that is, a conversion circuit (such as a charging IC) is provided on the second charging channel 24. The conversion circuit may perform constant voltage and constant current control on the charging process of the battery 30, and adjust, for example, step up or step down, the initial voltage provided by the power supply device 10 according to actual needs. In an embodiment of the present disclosure, the boost function of the conversion circuit may be used to boost the initial voltage provided by the power supply device 10 to the target voltage.

Figure 10:
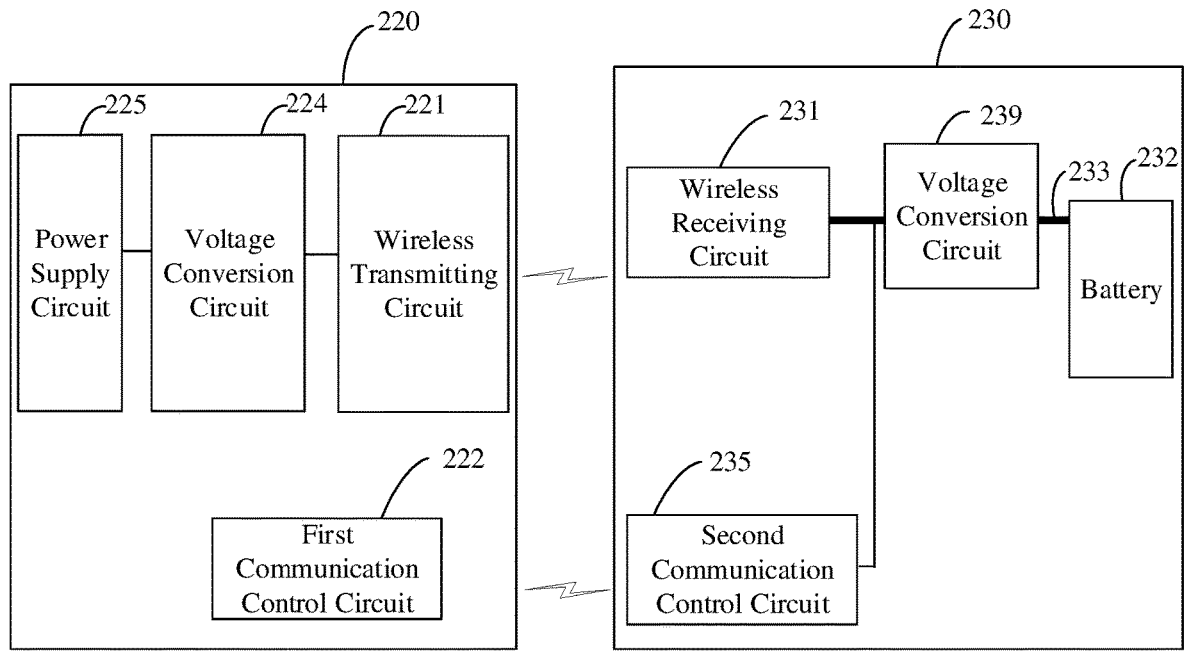
FIG. 10 is a schematic block diagram of a wireless charging system according to yet another embodiment of the present disclosure.

The communication control circuit 23 may implement switching between the first charging channel 21 and the second charging channel 24 through the switching element. In detail, as illustrated in FIG. 10, a switch tube Q5 may be provided on the first charging channel 21. When the communication control circuit 23 controls the switch tube Q5 to be switched on, the first charging channel 21 works to perform direct charge on the battery 30. When the communication control circuit 23 controls the switch tube Q5 to be switched off, the second charging channel 24 works, and is used to charge the battery 30.

In other embodiments, a circuit or an element for step-down may be provided on the second charging channel 24. When the voltage provided by the power supply device is greater than the voltage required by the battery 30, step-down processing may be performed. In=embodiments of the present disclosure, the circuit or module included in the second charging channel 24 is not limited.

A wireless charging process applied to an embodiment of the present disclosure will be described below with reference to FIGS. 8 to 11.

Generally, with the conventional wireless charging technology, the power supply device (such as the adapter) is coupled with a wireless charging device (such as a wireless charging base), and an output power of the power supply device is transmitted by the wireless charging device to a device to be charged in a wireless manner (such as through electromagnetic waves), thereby performing wireless charging on the device to be charged. The device to be charged may be the electronic device described above.

According to different wireless charging principles, wireless charging manners mainly include magnetic coupling (or electromagnetic induction), magnetic resonance and radio waves. Currently, mainstream wireless charging standards include QI standards, power matters alliance (PMA) standards, and the alliance for wireless power (A4WP). Both the QI standards and the PMA standards use magnetic coupling for wireless charging. The A4WP standards use magnetic resonance for wireless charging.

A wireless charging method according to an embodiment is described below with reference to FIG. 8.

Figure 8:
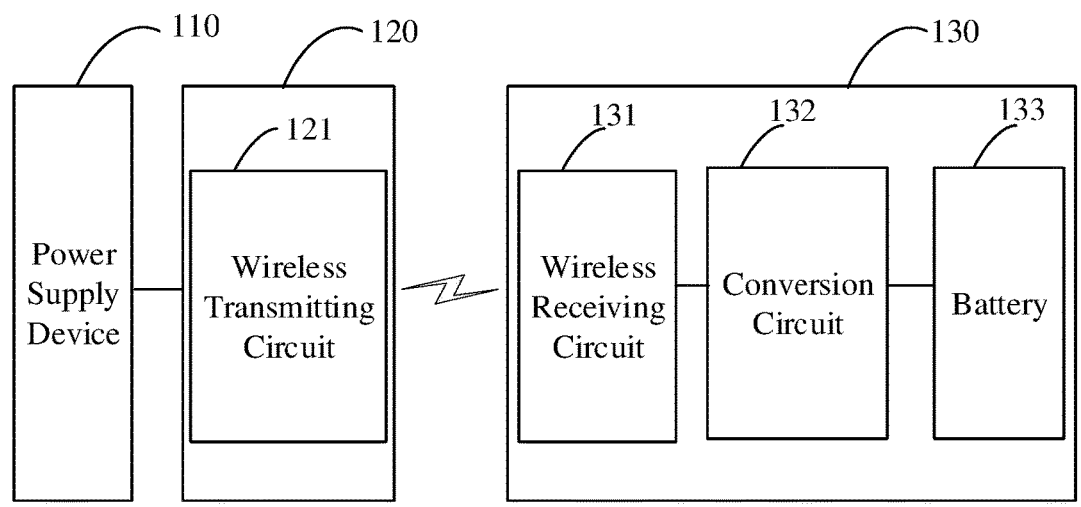
FIG. 8 is a schematic block diagram of a wireless charging system according to an embodiment of the present disclosure.

As illustrated in FIG. 8, a wireless charging system includes a power supply device 110, a transmitting device 120 for wireless charging signals, and a charging control device 130. The transmitting device 120 may be, for example, a wireless charging base, and the charging control device 130 may refer to a device to be charged, such as a terminal.

After the power supply device 110 is connected to the transmitting device 120, an output voltage and output current of the power supply device 110 are transmitted to the transmitting device 120.

The transmitting device 120 may convert the output voltage and output current of the power supply device 110 into wireless charging signals (for example, electromagnetic signals) for transmission through a wireless transmitting circuit 121 inside the transmitting device 120. For example, the wireless transmitting circuit 121 may convert the output current of the power supply device 110 into an alternating current, and convert the alternating current into a wireless charging signal through a transmitting coil or a transmitting antenna.

FIG. 8 illustrate a schematic diagram of a wireless charging system, and embodiments of the present disclosure is not limited thereto. For example, the transmitting device 120 may also be referred to as a transmitting device for wireless charging signals, and the charging control device 130 may also be referred to as a receiving device for wireless charging signals. The receiving device for wireless charging signals may be, for example, a chip having a function of receiving wireless charging signals, and may receive wireless charging signals transmitted by the transmitting device 120. The receiving device for wireless charging signals may also be the device to be charged.

The charging control device 130 may receive the wireless charging signal transmitted by the wireless transmitting circuit 121 through a wireless receiving circuit 131 and convert the wireless charging signal into an output voltage and an output current of the wireless receiving circuit 131. For example, the wireless receiving circuit 131 may convert the wireless charging signal transmitted by the wireless transmitting circuit 121 into an alternating current through the receiving coil or the receiving antenna, and perform operations such as rectification and/or filtering on the alternating current to convert the alternating current into the output voltage and output current of the wireless receiving circuit 131.

In some embodiments, before wireless charging, the transmitting device 120 and the charging control device 130 may pre-negotiate a transmitting power of the wireless transmitting circuit 121. Assuming that the power negotiated by the transmitting device 120 and the charging control device 130 is 5 W, the output voltage and output current of the wireless receiving circuit 131 are generally 5V and 1 A, respectively. Assuming that the power negotiated by the transmitting device 120 and the charging control device 130 is 10.8 W, the output voltage and output current of the wireless receiving circuit 131 are generally 9V and 1.2 A, respectively.

When the output voltage of the wireless receiving circuit 131 is not suitable for being directly loaded to both ends of the battery 133, it is necessary to first perform constant voltage and/or constant current control through the conversion circuit 132 in the charging control device 130, to obtain the charging voltage and/or charging current expected by the battery 133 in the charging control device 130.

The conversion circuit 132 may be configured to convert the output voltage of the wireless receiving circuit 131, so that the output voltage and/or output current of the conversion circuit 132 may meet requirements of the charging voltage and/or charging current expected by the battery 133.

As an example, the conversion circuit 132 may be, for example, a charging integrated circuit (IC), or may be a power management circuit. During the charging process of the battery 133, the conversion circuit 132 may be configured to manage the charging voltage and/or charging current of the battery 133. The conversion circuit 132 may include a voltage feedback function and/or a current feedback function, so as to manage the charging voltage and/or charging current of the battery 133.

In the normal charging process, the charging voltage and/or charging current required by the battery may change continuously at different charging stages. Consequently, the output voltage and/or output current of the wireless receiving circuit may need to be continuously adjusted to meet present charging requirements of the battery. For example, in the constant current charging stage of the battery, the charging current of the battery remains unchanged during the charging process, but the voltage of the battery is constantly increasing, and thus the charging voltage required by the battery is also continuously increasing. As the charging voltage required by the battery increases, a charging power required by the battery also continuously increases. When the charging power required by the battery increases, the wireless receiving circuit needs to increase the output power to meet charging requirements of the battery.

When the output power of the wireless receiving circuit is less than the charging power presently required by the battery, the communication control circuit may send instruction information to the transmitting device to instruct the transmitting device to increase the transmitting power, and further to increase the output power of the wireless receiving circuit. Therefore, during the charging process, the communication control circuit may communicate with the transmitting device, so that the output power of the wireless receiving circuit may meet the charging requirements of the battery in different charging stages.

A communication manner between the communication control circuit 235 and the transmitting device 220 is not limited in embodiments of the present disclosure. Optionally, in some embodiments, the communication control circuit 235 may communicate with the transmitting device 220 through wireless communication methods such as Bluetooth communication, wireless fidelity (Wi-Fi) communication or backscatter modulation (or power load modulation) communication, short-distance wireless communication based on a high carrier frequency, optical communication, ultrasonic communication, ultra-wideband communication, or mobile communication.

In an embodiment, a short-distance wireless communication module based on a high carrier frequency may include an integrated circuit (IC) chip with an extremely high frequency (EHF) antenna packaged therein. Optionally, the high carrier frequency may be 60 GHz.

In an embodiment, the optical communication may be performed by an optical communication module. The optical communication module may include an infrared communication module, and the infrared communication module may transmit information with infrared rays.

In an embodiment, the mobile communication may be performed by a mobile communication module. The mobile communication module may use 5G communication protocols, 4G communication protocols, or 3G communication protocols to perform information transmission.

Compared with the method that communication is performed by coupling to a coil of the wireless receiving circuit through signal modulation in the Qi standards, the above-mentioned wireless communication method may improve the reliability of the communication, and avoid effects from voltage ripples caused by communication implemented through signal coupling on voltage processing of the buck circuit.

Optionally, the communication control circuit 235 may also communicate with the transmitting device 220 through a data interface in a wired communication manner.

Figure 9:
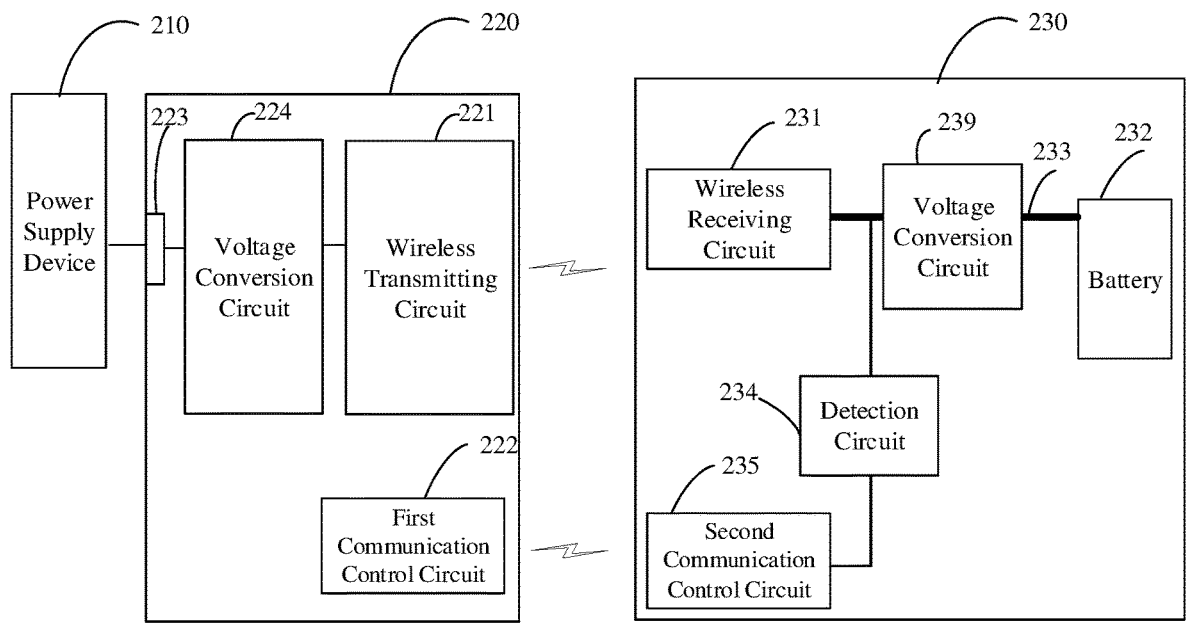
FIG. 9 is a schematic block diagram of a wireless charging system according to another embodiment of the present disclosure.

FIG. 9 is another schematic diagram of a charging system according to an embodiment of the present disclosure. Referring to FIG. 9, the transmitting device 220 for wireless charging signals may further include a charging interface 223. The charging interface 223 may be configured to connect with an external power supply device 210. The wireless transmitting circuit 221 may be further configured to generate a wireless charging signal according to an output voltage and an output current of the power supply device 210.

A first communication control circuit 222 may also adjust an amount of power drawn by the wireless transmitting circuit 221 from an output power of the power supply device 210 during the wireless charging process, to adjust a transmitting power of the wireless transmitting circuit 221, so that the power transmitted by the wireless transmitting circuit may meet charging requirements of the battery. For example, the power supply device 210 may also directly output a relatively large fixed power (such as 40 W), and the first communication control circuit 222 may directly adjust the amount of power drawn by the wireless transmitting circuit 221 from the fixed power provided by the power supply device 210.

In an embodiment of the present disclosure, the output power of the power supply device 210 may be fixed. For example, the power supply device 210 may directly output a relatively large fixed power (such as 40 W), and the power supply device 210 may provide the output voltage and output current to the wireless charging device 220 according to the fixed output power. During the charging process, the first communication control circuit 222 may draw a certain amount of power from the fixed power of the power supply device according to actual requirements, for wireless charging. That is to say, according to an embodiment of the present disclosure, a control right for adjusting the transmitting power of the wireless transmitting circuit 221 is allocated to the first communication control circuit 222, so that after receiving the instruction information transmitted by the second communication control circuit 235, the first communication control circuit 222 may immediately adjust the transmitting power of the wireless transmitting circuit 221 to meet the present charging requirements of the battery, which has advantages of fast adjustment speed and high efficiency.

The manner in which the first communication control circuit 222 draws an amount of power from the maximum output power provided by the power supply device 210 is not limited in embodiments of the present disclosure. For example, a voltage conversion circuit 224 may be provided inside the transmitting device 220 for wireless charging signals. The voltage conversion circuit 224 may be connected to a transmitting coil or a transmitting antenna for adjusting the power received by the transmitting coil or the transmitting antenna. The voltage conversion circuit 224 may include, for example, a pulse width modulation (PWM) controller and a switch unit. The first communication control circuit 222 may adjust the transmitting power of the wireless transmitting circuit 221 by adjusting a duty cycle of a control signal transmitted by the PWM controller.

The type of the power supply device 210 is not limited in embodiments of the present disclosure. For example, the power supply device 210 may be a device such as an adapter, a power bank, a vehicle-mounted charger, or a computer.

The type of the charging interface 223 is not limited in embodiments of the present disclosure. Optionally, in some embodiments, the charging interface 223 may be a USB interface. The USB interface may be, for example, a USB 2.0 interface, a micro USB interface, or a USB TYPE-C interface. Optionally, in other embodiments, the charging interface 223 may also be a lightning interface, or any other type of parallel port and/or serial port that may be used for charging.

The communication manner between the first communication control circuit 222 and the power supply device 210 is not limited in embodiments of the present disclosure. As an example, the first communication control circuit 222 may be connected to the power supply device 210 through a communication interface other than the charging interface, and communicate with the power supply device 210 through the communication interface. As another example, the first communication control circuit 222 may communicate with the power supply device 210 in a wireless manner. For example, the first communication control circuit 222 may perform near field communication (NFC) with the power supply device 210. As yet another example, the first communication control circuit 222 may communicate with the power supply device 210 through the charging interface 223 without setting an additional communication interface or other wireless communication module, thereby simplifying the implementation of the wireless charging device 220. For example, the charging interface 223 is a USB interface, and the first communication control circuit 222 may communicate with the power supply device 210 based on data lines (such as D+ and/or D− lines) in the USB interface. For another example, the charging interface 223 may be a USB interface (such as a USB TYPE-C interface) supporting a power delivery (PD) communication protocol, and the first communication control circuit 222 may communicate with the power supply device 210 based on the PD communication protocol.

Optionally, the first communication control circuit 222 adjusting the transmitting power of the wireless charging signal may refer to that the first communication control circuit 222 adjusts the transmitting power of the wireless charging signal by adjusting the input voltage and/or the input current of the wireless transmitting circuit 221. For example, the first communication control circuit may increase the transmitting power of the wireless transmitting circuit by increasing the input voltage of the wireless transmitting circuit.

Figure 11:
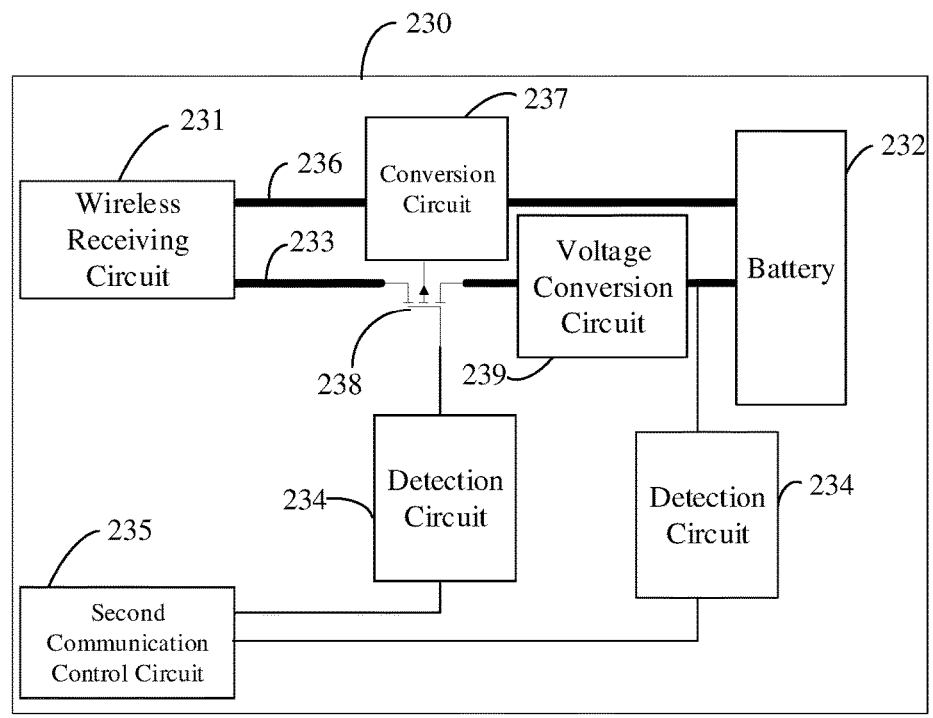
FIG. 11 is a schematic block diagram of a wireless charging system according to still yet another embodiment of the present disclosure.

Optionally, as illustrated in FIG. 11, a device to be charged 230 further includes a first charging channel 233 through which an output voltage and/or output current of a wireless receiving circuit 231 may be provided to a battery 232 for charging the battery 232.

Optionally, a voltage conversion circuit 239 may be further provided on the first charging channel 233. An input end of the voltage conversion circuit 239 is electrically connected to an output end of the wireless receiving circuit 231, and the voltage conversion circuit 239 is configured to perform constant voltage and/or constant current control on the output voltage of the wireless receiving circuit 231, for charging the battery 232, so that the output voltage and/or output current of the voltage conversion circuit 239 matches the charging voltage and/or charging current presently required by the battery.

Optionally, increasing the transmitting power of the wireless transmitting circuit 221 may refer to increasing the transmitting voltage of the wireless transmitting circuit 221, and increasing the transmitting voltage of the wireless transmitting circuit 221 may be achieved by increasing the output voltage of the voltage conversion circuit 224. For example, after the first communication control circuit 222 receives instruction information for increasing the transmitting power transmitted by the second communication control circuit 235, the transmitting power of the wireless transmitting circuit 221 may be increased by increasing the output voltage of the voltage conversion circuit 224.

The manner in which the second communication control circuit 235 transmits the instruction information to the first communication control circuit 222 is not limited in embodiments of the present disclosure.

For example, the second communication control circuit 235 may periodically transmit the instruction information to the first communication control circuit 222. Alternatively, the second communication control circuit 235 may transmit the instruction information to the first communication control circuit 222 only when the voltage of the battery reaches the charge cut-off voltage or the charging current of the battery reaches the charge cut-off current.

Optionally, a receiving device for wireless charging signals may further include a detection circuit 234, which may detect the voltage and/or the charging current of the battery 232. The second communication control circuit 235 may, based on the voltage and/or the charging current of the battery 232, send the instruction information to the first communication control circuit 222 to instruct the first communication control circuit 222 to adjust the output voltage and output current corresponding to the transmitting power of the wireless transmitting circuit 221.

In an embodiment, for the device to be charged, during the constant current charging process, the voltage of the battery will continuously increase, and the charging power required by the battery will also increase accordingly. At this time, the transmitting power of the wireless charging signal needs to be increased to meet the present charging requirements of the battery. In the process of constant voltage charging, the charging current of the battery may continuously decrease, and the charging power required by the battery will also decrease accordingly. At this time, the transmitting power of the wireless charging signal needs to be reduced to meet the present charging requirements of the battery.

The first communication control circuit 222 adjusting the transmitting power of the wireless charging signal according to the instruction information may refer to that the first communication control circuit 222 adjusts the transmitting power of the wireless charging signal so that the transmitting power of the wireless charging signal matches the charging voltage and/or charging current presently required by the battery.

The transmitting power of the wireless transmitting circuit 221 matching the charging voltage and/or charging current presently required by the battery 232 may refer to that, the transmitting power of the wireless charging signal is configured by the first communication control circuit 222 such that the output voltage and/or output current of the first charging channel 233 matches the charging voltage and/or charging current presently required by the battery 232 (or, the transmitting power of the wireless charging signal is configured by the first communication control circuit 222 such that the output voltage and/or output current of the first charging channel 233 meets the charging requirements of the battery 232 (including requirements on the charging voltage and/or charging current of the battery 232).

It should be understood that, in an embodiment of the present disclosure, "the output voltage and/or output current of the first charging channel 233 matching the charging voltage and/or charging current presently required by the battery 232" includes that, a voltage value and/or current value of the direct current output by the first charging channel 233 is equal to a charging voltage value and/or charging current value required by the battery 232 or within a preset fluctuation range (for example, the voltage value fluctuates at 100 millivolts to 200 millivolts, and the current value fluctuates at 0.001 A to 0.005 A, etc.).

The second communication control circuit 235 operates based on the voltage and/or charging current of the battery 232 detected by the detection circuit 234.

The device to be charged 230 may further include the detection circuit 234, which may be configured to detect the open circuit voltage of the battery. The second communication control circuit 235 may perform wireless communication with the first communication control circuit 222 according to the open circuit voltage of the battery detected by the detection circuit 234, so that the battery may switch between charging stages.

For example, for the first constant current stage described above, when the detection circuit detects that the open circuit voltage of the battery 232 reaches the first cut-off voltage, the second communication control circuit 235 may perform wireless communication with the first communication control circuit 222 so that the wireless transmitting circuit 221 adjusts the transmitting power until the charging current corresponding to the transmitting power of the wireless transmitting circuit 221 matches the charging current corresponding to the second constant current stage.

When the open circuit voltage of the battery 232 reaches the standard limited charging voltage, the second communication control circuit 235 may perform wireless communication with the first communication control circuit 222 to instruct the power supply device 210 to stop supplying power to the battery 232, and further to end the charging.

The detection circuit 234 may also detect the output voltage and/or charging current of the battery, so that the first communication control circuit 222 adjusts the transmitting power of the wireless transmitting circuit 221 according to the output voltage and/or charging current of the battery 232, which may be as follows. During the constant current charging stage of the battery 232, the second communication control circuit 235 performs wireless communication with the first communication control circuit 222 according to the detected output voltage of the battery, so that the first communication control circuit 222 adjusts the transmitting power of the wireless transmitting circuit 221 until the output voltage of the first charging channel 233 matches the charging voltage required by the battery in the constant current charging stage (or until the output voltage of the first charging channel 233 meets requirements on the charging voltage of the battery 232 in the constant current charging stage).

FIG. 10 is another example of a charging system according to an embodiment of the present disclosure. The transmitting device 220 for wireless charging signals corresponding to the embodiment of FIG. 10 does not obtain electric power from the power supply device 210, but directly converts an externally input alternating current (such as commercial power) into the wireless charging signal.

As illustrated in FIG. 10, the transmitting device 220 for wireless charging signals may further include the voltage conversion circuit 224 and a power supply circuit 225. The power supply circuit 225 may be configured to receive the externally input alternating current (such as commercial power), and generate an output voltage and an output current of the power supply circuit 225 according to the alternating current. For example, the power supply circuit 225 may perform rectification and/or filtering on the alternating current to obtain a direct current or a pulsating direct current, and transmit the direct current or the pulsating direct current to the voltage conversion circuit 224.

The voltage conversion circuit 224 may be configured to receive the output voltage of the power supply circuit 225 and convert the output voltage of the power supply circuit 225 to obtain an output voltage and output current of the voltage conversion circuit 224. The wireless transmitting circuit 221 may be further configured to generate a wireless charging signal according to the output voltage and output current of the voltage conversion circuit 224.

In an embodiment of the present disclosure, an adapter-like function is integrated in the transmitting device 220 for wireless charging signals, so that the transmitting device 220 for wireless charging signals does not need to obtain power from an external power supply device, thereby increasing the integration of the transmitting device 220 for wireless charging signals, and reducing the number of devices required to implement the wireless charging process.

Optionally, in some embodiments, the transmitting device 220 for wireless charging signals may support a first wireless charging mode and a second wireless charging mode. The speed for the transmitting device 220 charging the device to be charged in the first wireless charging mode is faster than the speed for the transmitting device 220 charging the device to be charged in the second wireless charging mode. In other words, compared with the transmitting device 220 for wireless charging signals operating in the second wireless charging mode, the transmitting device 220 for wireless charging signals operating in the first wireless charging mode takes less time to fully charge the battery in the device to be charged with the same capacity.

The charging method according to embodiments of the present disclosure may enable charging in the first charging mode or charging in the second charging mode, which is not limited in embodiments of the present disclosure.

The second wireless charging mode may be referred to as a common wireless charging mode, and may be, for example, a conventional wireless charging mode based on the QI standards, the PMA standards, or the A4WP standards. The first wireless charging mode may be a fast wireless charging mode. The common wireless charging mode may refer to a wireless charging mode in which the transmitting power of the transmitting device 220 for wireless charging signals is small (usually less than 15 W, and a commonly used transmitting power is 5 W or 10 W). It usually takes several hours to fully charge a battery with a large capacity (such as a battery with a capacity of 3,000 mAh) in the common wireless charging mode. In the fast wireless charging mode, the transmitting power of the transmitting device 220 for wireless charging signals is relatively large (usually greater than or equal to 15 W). Compared with the common wireless charging mode, the charging time required by the transmitting device 220 for wireless charging signals to fully charge a battery with the same capacity in the fast wireless charging mode may be significantly shortened, and the charging speed is faster.

Referring to FIG. 11, in an embodiment of the present disclosure, the device to be charged 230 further includes a second charging channel 236. The second charging channel 236 may be a wire. A conversion circuit 237 may be provided on the second charging channel 236 for performing voltage control on the direct current output from the wireless receiving circuit 231, so as to obtain an output voltage and an output current of the second charging channel 236 for charging the battery 232.

In one embodiment, the conversion circuit 237 may be integrated in a buck circuit and outputs power with constant current and/or constant voltage. In other words, the conversion circuit 237 may be configured to perform constant voltage and/or constant current control on the charging process of the battery.

When the second charging channel 236 is adopted to charge the battery 232, the wireless transmitting circuit 221 may transmit an electromagnetic signal with a constant transmitting power. After the electromagnetic signal is received by the wireless receiving circuit 231, the electromagnetic signal is processed by the conversion circuit 237 into a voltage and a current that satisfy the charging requirements of the battery 232, and the voltage and the current are input into the battery 232 to charge the battery 232. It should be understood that, in some embodiments, the constant transmitting power does not necessarily mean that the transmitting power remains completely unchanged, rather, the transmitting power may vary within a certain range, for example, the transmitting power is 7.5 W and fluctuates by 0.5 W.

In an embodiment of the present disclosure, the charging mode for charging the battery 232 through the first charging channel 233 is referred to as the first wireless charging mode, and the charging mode for charging the battery 232 through the second charging channel 236 is referred to as the second wireless charging mode. The transmitting device for wireless charging signals and the device to be charged may determine whether to charge the battery 232 in the first wireless charging mode or the second wireless charging mode through handshake communication.

In an embodiment of the present disclosure, for the transmitting device for wireless charging signals, when the device to be charged is charged in the first wireless charging mode, the maximum transmitting power of the wireless transmitting circuit 221 may be a first transmitting power value. When the device to be charged is charged in the second wireless charging mode, the maximum transmitting power of the wireless transmitting circuit 221 may be a second transmitting power value. The first transmitting power value is greater than the second transmitting power value. Therefore, the speed of charging the device to be charged in the first wireless charging mode is greater than the speed of charging the device to be charged in the second wireless charging mode.

Optionally, the second communication control circuit 235 may be further configured to control switching between the first charging channel 233 and the second charging channel 236. For example, as illustrated in FIG. 14, a switch 238 may be provided on the first charging channel 233. The second communication control circuit 235 may control the switching between the first charging channel 233 and the second charging channel 236 by controlling the switch 238 to switch on or off. It was pointed out above that in some embodiments, the transmitting device 220 for wireless charging signals may include the first wireless charging mode and the second wireless charging mode, and the speed for the transmitting device 220 for wireless charging signals to charge the device to be charged 230 in the first wireless charging mode is faster than the speed for the transmitting device 220 for wireless charging signals to charge the device to be charged 230 in the second wireless charging mode. When the transmitting device 220 for wireless charging signals uses the first wireless charging mode to charge the battery in the device to be charged 230, the device to be charged 230 may control the first charging channel 233 to work; and when the transmitting device 220 for wireless charging signals uses the second wireless charging mode to charge the battery in the device to be charged 230, the device to be charged 230 may control the second charging channel 236 to work.

On the side of the device to be charged, the second communication control circuit 235 may switch between the first charging channel 233 and the second charging channel 236 according to a charging mode. When the first wireless charging mode is adopted, the second communication control circuit 235 controls the voltage conversion circuit 239 on the first charging channel 233 to work. When the second wireless charging mode is adopted, the second communication control circuit 235 controls the conversion circuit 237 on the second charging channel 236 to work.

Optionally, the transmitting device 220 for wireless charging signals may communicate with the device to be charged 230 to negotiate a charging mode between the transmitting device 220 for wireless charging signals and the device to be charged 230.

In addition to the communication content described above, the first communication control circuit 222 in the transmitting device 220 for wireless charging signals and the second communication control circuit 235 in the device to be charged 230 may also exchange other communication information. In some embodiments, the first communication control circuit 222 and the second communication control circuit 235 may exchange information for safety protection, abnormality detection or fault processing, such as temperature information of the battery 232, instruction information indicating entering overvoltage protection or overcurrent protection, and power transmitting efficiency information (the power transmitting efficiency information may be configured to indicate the power transmitting efficiency between the wireless transmitting circuit 221 and the wireless receiving circuit 231).

Optionally, the communication between the second communication control circuit 235 and the first communication control circuit 222 may be unidirectional communication or bidirectional communication, which is not specifically limited in embodiments of the present disclosure.

In an embodiment of the present disclosure, the function of the second communication control circuit may be implemented by an application processor of the device to be charged 230, thereby saving hardware costs. Alternatively, the function of the second communication control circuit may be implemented by an independent control chip, which may improve the reliability of control.

Optionally, in an embodiment of the present disclosure, both the wireless receiving circuit 231 and the voltage conversion circuit 239 may be integrated in the same wireless charging chip, so that the integration of the device to be charged may be improved, and the implementation of the device to be charged is simplified. For example, functions of the conventional wireless charging chips may be extended to support charging management functions.

The above embodiments may be implemented in whole or in part by software, hardware, firmware, or any other combination. When implemented by software, the embodiments may be implemented in whole or in part in the form of a computer program product. The computer program product includes one or more computer instructions. When the computer program instructions are loaded and executed on a computer, all or some of the processes or functions according to the embodiments of the present disclosure are generated. The computer may be a general-purpose computer, a special-purpose computer, a computer network, or other programmable devices. The computer instructions may be stored in a computer readable storage medium or transmitted from one computer readable storage medium to another computer readable storage medium, for example, the computer instructions may be transmitted from one website site, computer, server, or data center to another website site, computer, server, or data center by wired (such as a coaxial cable, an optical fiber and a digital subscriber line (DSL)) or wireless (such as infrared, wireless, microwave, etc.) means. The computer readable storage medium may be any available medium that may be accessed by a computer or a data storage device such as a server, a data center, and the like that integrates one or more available media. The available medium may be a magnetic medium (for example, a floppy disk, a hard disk, a magnetic tape), an optical medium (for example, a digital video disc (DVD)), a semiconductor medium (for example, a solid state disk (SSD)), and so on.

Those skilled in the art may realize that the units and algorithm steps of each example described in combination with the embodiments disclosed herein can be implemented by electronic hardware or a combination of computer software and electronic hardware. Whether these functions are performed in hardware or software depends on the specific application and design constraints of the technical solutions. Those skilled in the art can use different methods to implement the described functions for each specific application, and such an implementation should not be considered to be beyond the scope of the present disclosure.

In several embodiments provided by the present disclosure, it should be understood that, the system, devices and method disclosed in several embodiments provided by the present disclosure can be realized in any other manner. For example, the device embodiments described above can be merely examples, for example, the units are just divided according to logic functions. In practical implementation, the units can be divided in other manners, for example, multiple units or components can be combined or integrated into another system, or some features can be omitted or not executed. In addition, the mutual coupling or direct coupling or communication connection described or discussed can be via some interfaces, and indirect coupling or communication connection between devices or units may be electrical, mechanical or of other forms.

The units illustrated as separate components can be or not be separated physically, and components described as units can be or not be physical units, i.e., can be located at one place, or can be distributed onto multiple network units. It is possible to select some or all of the units according to actual needs, for realizing the objective of embodiments of the present disclosure.

In addition, respective functional units in respective embodiments of the present disclosure can be integrated into one processing unit, or can be present as separate physical entities. It is also possible that two or more than two units are integrated into one unit.

The above is only a specific implementation of the present disclosure, and the protection scope of the present disclosure is not limited to this. Any person skilled in the art can easily think of changes or replacements within the technical scope disclosed in the present disclosure, and the changes and replacements should be covered by the protection scope of the present disclosure. Therefore, the protection scope of the present disclosure shall be subject to the protection scope of the attached claims.

What is claimed is:

1. A charging method, configured to charge a battery, a charging process of the battery comprising at least one constant current stage, the at least one constant current stage comprising a first constant current stage, and the charging method comprising:
   determining an open circuit voltage of the battery according to a pre-established model and at least one first parameter of the battery in the charging process, wherein the pre-established model comprises a correspondence relationship between the open circuit voltage of the battery and the at least one first parameter; and
   in the first constant current stage, applying a first current to the battery until at least one of the open circuit voltage of the battery reaches a first cut-off voltage or a charging voltage of the battery reaches a preset target voltage, the first cut-off voltage being less than or equal to a standard limited charging voltage of the battery,
   wherein the charging voltage of the battery is less than the open circuit voltage of the battery during the charging process, and
   wherein during a process of applying the first current to the battery, the open circuit voltage of the battery is less than or equal to the first cut-off voltage and the charging voltage of the battery is less than or equal to the preset target voltage.

2. The charging method of claim 1, wherein the battery comprises a plurality of cells, and applying the first current to the battery until the open circuit voltage of the battery reaches the first cut-off voltage comprises:
   applying the first current to the battery until a voltage of at least one of the plurality of cells reaches the first cut-off voltage.

3. The charging method of claim 1, wherein when the open circuit voltage of the battery is less than or equal to the first cut-off voltage, a charging voltage of the battery is less than or equal to a preset target voltage, and the preset target voltage is greater than the standard limited charging voltage of the battery.

4. The charging method of claim 1, wherein the at least one constant current stage further comprises a second constant current stage, the charging method further comprises:
   in response to the open circuit voltage of the battery reaching the first cut-off voltage, entering the second constant current stage for applying a second current to the battery, the second current being less than the first current.

5. The charging method of claim 1, wherein the first constant current stage is a last one of the at least one constant current stage, and the charging method further comprises:
   in response to the open circuit voltage of the battery reaching the first cut-off voltage, terminating the charging.

6. The charging method of claim 1, wherein the first constant current stage is a last one of the at least one constant current stage, the charging process of the battery further comprises at least one constant voltage stage, the at least one constant voltage stage comprises a first constant voltage stage, and the charging method further comprises:
   in response to the open circuit voltage of the battery reaching the first cut-off voltage, entering the first constant voltage stage for applying a first voltage to the battery, the first voltage being greater than the first cut-off voltage.

7. The charging method of claim 6, wherein applying the first voltage to the battery comprises:
   applying the first voltage to the battery until the open circuit voltage of the battery reaches a second cut-off voltage, the second cut-off voltage being less than or equal to the standard limited charging voltage of the battery and being greater than the first cut-off voltage.

8. The charging method of claim 7, wherein the at least one constant voltage stage further comprises a second constant voltage stage, and the charging method further comprises:
   in response to the open circuit voltage of the battery reaching the second cut-off voltage, entering the second constant voltage stage for applying a second voltage to the battery, the second voltage being greater than the second cut-off voltage and less than the first voltage.

9. The charging method of claim 7, wherein the first constant voltage stage is a last one of the at least one constant voltage stage, and the charging method further comprises:
in response to the open circuit voltage of the battery reaching the second cut-off voltage, terminating the charging.

10. The charging method of claim 6, wherein the first voltage is less than or equal to a preset target voltage, and the preset target voltage is greater than the standard limited charging voltage of the battery.

11. The charging method of claim 1, wherein the first parameters comprise at least one of a charging voltage, a charging current, an electric quantity, or a temperature.

12. A charging device, configured to charge a battery, a charging process of the battery comprising at least one constant current stage, the at least one constant current stage comprising a first constant current stage, and the charging device comprising:
a processing circuit, configured to determine an open circuit voltage of the battery according to a pre-established model and at least one first parameter of the battery in the charging process, wherein the pre-established model comprises a correspondence relationship between the open circuit voltage of the battery and the at least one first parameter; and
a charging management circuit, configured to, in the first constant current stage, apply a first current to the battery until at least one of the open circuit voltage of the battery reaches a first cut-off voltage or a charging voltage of the battery reaches a preset target voltage, the first cut-off voltage being less than or equal to a standard limited charging voltage of the battery,
wherein the charging voltage of the battery is less than the open circuit voltage of the battery during the charging process,
wherein during a process of applying the first current to the battery, the open circuit voltage of the battery is less than or equal to the first cut-off voltage and the charging voltage of the battery is less than or equal to the preset target voltage.

13. The charging device of claim 12, wherein the battery comprises a plurality of cells, and the charging management circuit is configured to apply the first current to the battery until a voltage of at least one of the plurality of cells reaches the first cut-off voltage.

14. The charging device of claim 12, wherein the charging management circuit is further configured to:
in response to the open circuit voltage of the battery reaching the first cut-off voltage, enter a second constant current stage for applying a second current to the battery, the second current being less than the first current.

15. The charging device of claim 12, wherein the first constant current stage is a last one of the at least one constant current stage, and the charging management circuit is further configured to:
in response to the open circuit voltage of the battery reaching the first cut-off voltage, terminate the charging.

16. The charging device of claim 12, wherein the first constant current stage is a last one of the at least one constant current stage, the charging process of the battery further comprises at least one constant voltage stage, the at least one constant voltage stage comprises a first constant voltage stage, and the charging management circuit is further configured to:
in response to the open circuit voltage of the battery reaching the first cut-off voltage, enter the first constant voltage stage for applying a first voltage to the battery, the first voltage being greater than the first cut-off voltage.

17. The charging device of claim 16, wherein the charging management circuit is configured to:
apply the first voltage to the battery, until the open circuit voltage of the battery reaches a second cut-off voltage, the second cut-off voltage being less than or equal to the standard limited charging voltage of the battery and being greater than the first cut-off voltage.

18. The charging device of claim 17, wherein the at least one constant voltage stage further comprises a second constant voltage stage, and the charging management circuit is further configured to:
in response to the open circuit voltage of the battery reaching the second cut-off voltage, enter the second constant voltage stage for applying a second voltage to the battery, the second voltage being greater than the second cut-off voltage and less than the first voltage.

19. The charging device of claim 17, wherein the first constant voltage stage is a last one of the at least one constant voltage stage, and the charging management circuit is further configured to:
in response to the open circuit voltage of the battery reaching the second cut-off voltage, terminate the charging.

20. The charging device of claim 12, wherein the first parameters comprise at least one of a charging voltage, a charging current, an electric quantity, or a temperature.

* * * * *